United States Patent
Hosek et al.

(10) Patent No.: US 6,643,563 B2
(45) Date of Patent: Nov. 4, 2003

(54) TRAJECTORY PLANNING AND MOTION CONTROL STRATEGIES FOR A PLANAR THREE-DEGREE-OF-FREEDOM ROBOTIC ARM

(75) Inventors: Martin Hosek, Lowell, MA (US); Hakan Elmali, Groton, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 0 days.

(21) Appl. No.: 10/196,685

(22) Filed: Jul. 15, 2002

(65) Prior Publication Data

US 2003/0108415 A1 Jun. 12, 2003

Related U.S. Application Data

(60) Provisional application No. 60/305,177, filed on Jul. 13, 2001.

(51) Int. Cl.[7] ............................................. G06F 19/00
(52) U.S. Cl. .................. 700/245; 700/247; 700/248; 700/249; 700/250; 700/258; 700/259; 700/260; 700/261; 700/262; 700/263; 700/264; 700/900; 414/754; 414/777; 414/757; 414/814; 701/23; 74/490.03
(58) Field of Search ................................ 700/245, 275, 700/247, 248, 249, 250, 259, 260, 261, 262, 263, 264, 258, 900; 701/23; 74/490.03; 414/754, 757, 777, 814

(56) References Cited

U.S. PATENT DOCUMENTS

| | | | |
|---|---|---|---|
| 4,218,172 A | 8/1980 | Freund | 414/730 |
| 4,715,921 A | 12/1987 | Maher et al. | 156/345 |

(List continued on next page.)

OTHER PUBLICATIONS

Ghosh et al., Multisensor based intelligent planning and control for robotic manipulators on a mobile platform, 1996, IEEE, pp. 164–169.*

Ghosh et al., Calibration free visually controlled manipulation of parts in a robotic manufacturing workcell, 1996, IEEE, pp. 3197–3202.*

SPIE's International Technical Group Newsletter, Robotics and machine perception, 2000, Internet, pp. 1–12.*

Antonelli et al., Experiments of on–line path following under joint limits for an industrial robot manipulator, 2002, IEEE, pp. 513–518.*

ADIC, AML/2: Automated Mixed Media Library, Internet, 2000, pp. 1–6.

*Primary Examiner*—William A. Cuchlinski, Jr.
*Assistant Examiner*—McDieunel Marc
(74) *Attorney, Agent, or Firm*—Perman & Green, LLP

(57) ABSTRACT

A method for moving a substrate to a predetermined location with a specified orientation with a robotic manipulator, the robotic manipulator having a plurality of joint actuators and an end-effector for holding the substrate, wherein the end-effector is independently rotatable with respect to the remaining robotic manipulator. The method can select a reference point on the end-effector for determining a position of the end-effector, wherein the reference point is offset from a wrist of the robotic manipulator, determining a motion path for movement of the end-effector of robotic arm toward predetermined location with specified orientation, and generating motion profiles for translational and rotational components of movement of the end-effector of robotic manipulator along the motion path. The motion profiles are converted into joint motion profiles for each of the joint actuators of the robotic manipulator for implementing the movement of the end-effector to predetermined location with the specified orientation.

27 Claims, 15 Drawing Sheets

U.S. PATENT DOCUMENTS

| | | | |
|---|---|---|---|
| 4,730,976 A | 3/1988 | Davis et al. | 414/749 |
| 5,180,276 A | 1/1993 | Hendrickson | 414/752 |
| 5,404,894 A | 4/1995 | Shiraiwa | 134/66 |
| 5,546,366 A | 8/1996 | Dang | 369/36 |
| 5,647,724 A | 7/1997 | Davis, Jr. et al. | 414/744.5 |
| 5,655,060 A | 8/1997 | Lucas | 395/85 |
| 5,765,983 A | 6/1998 | Caveney et al. | 414/217 |
| 5,789,890 A | 8/1998 | Genov et al. | 318/567 |
| 6,216,058 B1 | 4/2001 | Hosek et al. | 700/245 |
| 6,275,748 B1 * | 8/2001 | Bacchi et al. | 700/275 |
| 6,360,144 B1 * | 3/2002 | Bacchi et al. | 700/250 |
| 6,366,830 B2 * | 4/2002 | Bacchi et al. | 700/250 |
| 6,438,460 B1 * | 8/2002 | Bacchi et al. | 700/275 |
| 6,453,214 B1 * | 9/2002 | Bacchi et al. | 700/245 |
| 2001/0020199 A1 * | 9/2001 | Bacchi et al. | 700/245 |
| 2002/0042666 A1 * | 4/2002 | Bacchi et al. | 700/275 |
| 2003/0055533 A1 * | 3/2003 | Bacchi et al. | 700/275 |

* cited by examiner

TRAJECTORY PLANNING AND MOTION CONTROL STRATEGIES FOR A PLANAR THREE-DEGREE-OF-FREEDOM ROBOTIC ARM

CROSS-REFERENCE TO RELATED APPLICATIONS

This application claims priority from U.S. Provisional Patent Application No. 60/305,177 filed on Jul. 13, 2001 which is incorporated by reference herein in its entirety.

BACKGROUND OF THE INVENTION

1. Field of the Invention

The present invention relates to a robotic manipulator and, more particularly, to planning, optimizing and controlling movement of a robotic manipulator.

2. Brief Description of Related Developments

Manufacturing technology for semiconductor integrated circuits (IC) and flat panel displays (FPD) includes processing of substrates such as silicon wafers or glass panels. The manufacturing technology typically includes a cluster tool which consists of a circular vacuum chamber with robot stations, such as load locks and process modules, connected radially at the circumference of the chamber in a star pattern. The cluster tool is serviced by a robot which is located at the center of the chamber and cycles the substrates from the load locks through the process modules and back to the load locks. In this process, the robot arm rotates, extends and retracts radially in a horizontal plane.

In order to position the substrate to a given point in the plane of operation, the robot arm needs to be capable of a planar motion with two degrees of freedom (DOF). Since the robot stations are connected radially to the chamber, the orientation of the end-effector needs to be kept radial regardless of the position of the robot arm. Typical arm designs include telescoping, scara and frogleg mechanisms. Examples of typical transport apparatus including such embodiments are described in U.S. Pat. Nos. 4,730,976, 4,715,921, 5,180,276, 5,404,894, 5,647,724, and 5,765,983, which are hereby incorporated by reference herein. In many applications, the robot arm is mounted on a vertical lift drive which provides an additional degree-of-freedom required for servicing stations at different vertical levels.

Typical drawbacks of the radial star pattern of the tool design include a relatively large footprint and inconvenient geometry for interfacing other processes in the factory. As a result, cluster tools with robot stations arranged in a non-radial manner have been introduced. A typical example is an atmospheric transfer module which serves as an interface between standardized load ports serviced by an external transportation system and load locks of a conventional vacuum cluster tool. In order to access non-radial stations, the robot arm needs to be capable of positioning the end-effector to a given point with a specified orientation, i.e., providing three degrees of freedom in the plane of operation. A conventional 2DOF robot manipulator cannot access non-radial stations.

A planar three-degree-of-freedom (3DOF) robotic arm refers to a mechanical device that can position a payload in the plane of operation to a given point with a specified orientation. A typical example of such a mechanism is a planar three-link manipulator, or robot arm, comprising an upper arm, forearm and end-effector that are coupled and actuated through revolute joints. The revolute joints are referred to as the shoulder, elbow and wrist joints, respectively. An alternative is a four-link design, as typified by U.S. Pat. No. 5,789,890, which is hereby incorporated by reference herein.

In order to move the end-effector of the robot arm from its initial location to a specified destination position, a path along which the robot end-effector moves is determined. The generation of the path is an objective of trajectory planning. Examples of trajectory generation are described in U.S. Pat. Nos. 5,655,060 and 6,216,058, which are hereby incorporated by reference herein. Trajectory planning calculates motion profiles for robot actuators (motors) which drive the robot arm so that a smooth motion of the end-effector along the desired path is achieved. The motion profiles are typically generated in terms of position, velocity and acceleration of the robot actuators, and are fed to the robot motion controller as reference control inputs. Path planning for typical pick-place robotic manipulators depends primarily on the geometry of the robot workspace and the particular task performed. However, the motion profiles may be constrained by, for example, the speed-torque characteristics of the robot actuators, maximum allowable acceleration of the end-effector to prevent payload slippage, or maximum allowable velocity to comply with safety-related requirements.

In order to keep the substrate near the original position at the entrance of the station while aligning the end-effector with the desired access path when the robotic manipulator is under manual control or in a station teaching mode, rotational motion of the end-effector with respect to the wrist joint of the robotic arm is required. However, the rotational motion of the end-effector with respect to the wrist joint can move the substrate from the original position near the entrance of the work station. An iterative approach involving repeated translations of the robotic manipulator is required to keep the substrate near the original position at the entrance of the work station while aligning the end-effector with the desired access path. This requires repeated attempts and more time to move the end-effector of the robotic arm to its desired position and orientation.

The trajectory planning must be completed before the robot arm can be moved. Therefore, the more complex the calculations for determining the path and generating the motion profiles, and the greater the number of calculations required, the more time is required to move the robot arm. Alternatively, more powerful and more expensive controllers can be employed. In addition, since the motion profiles are calculated at equally spaced time instants before the motion of the robotic manipulator starts, a large amount of data associated with the motion profiles must be stored in the controller, resulting in large memory requirements and expensive memory components.

Once the motion profiles have been generated, motion control determines commanded torques for the robot actuators so that the robot actuators track the desired motion profiles. Typical centralized control architectures are not suitable for robotic manipulators with actuators installed in the robotic arm because a large number of long signal wires must be fed through the links, joints and slip-rings of the robotic arm, which translates to high assembly costs and reliability risks. Typical distributed control approaches either run independent joint-based feedback loops, which do not account for dynamic coupling between links and other members of the robotic manipulator and, therefore, provide limited trajectory tracking performance, or utilize high-speed communication networks to share run-time data, which is technically difficult to implement for robotic arms with slip-rings at the joints due to noise, communication bandwidth and reliability related issues.

SUMMARY OF THE INVENTION

The present invention is directed to a method for moving a substrate to a predetermined location with a specified orientation with a robotic manipulator, the robotic manipulator having a plurality of joint actuators and an end-effector for holding the substrate, wherein the end-effector is independently rotatable with respect to the remaining robotic manipulator. In one embodiment, the method comprises selecting a reference point on the end-effector for determining a position of the end-effector, wherein the reference point is offset from a wrist of the robotic manipulator, and determining a motion path for movement of the reference point on the end-effector of the robotic arm toward a predetermined location with a specified orientation. Motion profiles are generated for translation of the reference point on the end-effector along the motion path and rotation of the end-effector with respect to the reference point. The motion profiles are converted into joint motion profiles for each of the joint actuators of the robotic manipulator for implementing the movement of the end-effector to the predetermined location with the specified orientation.

The present invention is directed to an apparatus for movement of a substrate to a predetermined location with a specified orientation. In one embodiment, the apparatus comprises a robotic manipulator having a plurality of joint actuators and an end-effector for holding the substrate at an end of the robotic manipulator, wherein the robotic manipulator has three independent degrees of freedom. A controller is connected to the robotic manipulator for generating motion profiles for movement of a substrate holding area of the end-effector along a desired motion path. The controller is programmed for forming the motion profiles from a combination of a translation of the reference point along the motion path and substantially simultaneous rotation of the end-effector with respect to the reference point. The reference point on the end-effector is offset from a wrist of the robotic manipulator. The controller is adapted to determine a joint motion profile for each of the joint actuators of the robotic manipulator for implementing the motion profiles for movement of the end-effector to the predetermined location with the specified orientation.

The present invention is also directed to a method for moving a substrate with a robotic manipulator to a predetermined location with a specified orientation. In one embodiment, the method comprises providing the robotic manipulator with a plurality of joint actuators and an end-effector for holding the substrate at an end of the robotic manipulator. A first controller in communication with the robotic manipulator is provided for determining the desired joint motion profiles and commanded torques for the joint actuators associated with the first controller, and a second controller in communication with the robotic manipulator is provided for determining the desired joint motion profiles and commanded torques for the joint actuators associated with the second controller.

Nodal points of motion profiles are generated with the first controller for translation and rotation of the end-effector along the transfer path, and the nodal points are transmitted from the first controller to the second controller. A synchronized run-time calculation of the motion profiles is initiated in the first controller and in the second controller based on the generated nodal points in the first controller and in the second controller. The run-time calculation in the first controller and in the second controller are performed separately of each other.

The present invention is also directed to an apparatus for moving a substrate with a robotic manipulator to a predetermined location with a specified orientation. In one embodiment, the apparatus comprises an end-effector for holding the substrate at an end of the robotic manipulator, wherein the robotic manipulator has a plurality of joint actuators. A first controller is in communication with the robotic manipulator for determining the desired position of the joint actuators associated with the first controller, and a second controller is in communication with the robotic manipulator for determining the desired position of the joint actuators associated with the second controller.

The first controller is adapted to generate nodal points of the motion profiles in the first controller for translation and rotation of the end-effector along the motion path, and to transmit the nodal points from the first controller to the second controller. A communication line connects the first controller and the second controller for transmitting nodal points from the first controller to the second controller, wherein the first controller and the second controller separately perform run-time calculation of the motion profiles based on the generated nodal points in the first controller and in the second controller. The run-time calculation is initiated synchronously.

The present invention is further directed to a method for moving substrate between two points with a robotic arm having a distributed control system, a plurality of joint actuators for moving the robotic arm, and an end-effector for removeably retaining the substrate. In one embodiment, the method comprises generating motion profiles with a main controller coupled to the robotic arm for controlling at least one from the plurality of the joint actuators associated with the main controller, and generating the motion profiles with a remote controller coupled to the robotic arm for controlling at least one other from the plurality of joint actuators associated with the end-effector. The motion profiles in the main and remote controllers are executed separately from with each other, wherein the executing is synchronously initiated.

The present invention is further directed to a robotic arm with a distributed control system and an end-effector for moving substrate between two points. In one embodiment, the robotic arm comprises joint actuators coupled to the robotic arm for controlling the position and orientation of the robotic arm. A main controller for generating motion profiles for controlling at least one joint actuator is associated with the main controller from the joint actuators coupled to the robotic arm. A remote controller for generating the motion profiles for controlling at least one other joint actuator is associated with the end-effector from the joint actuators coupled to the robotic arm, wherein the substrate is removeably attached to the end-effector. The main controller and remote controller each execute their motion profiles separately from each other, wherein the execution is synchronously initiated.

BRIEF DESCRIPTION OF THE DRAWINGS

The foregoing aspects and other features of the present invention are explained in the following description, taken in connection with the accompanying drawings, wherein.

DETAILED DESCRIPTION OF THE PREFERRED EMBODIMENT(s)

Figure 1:
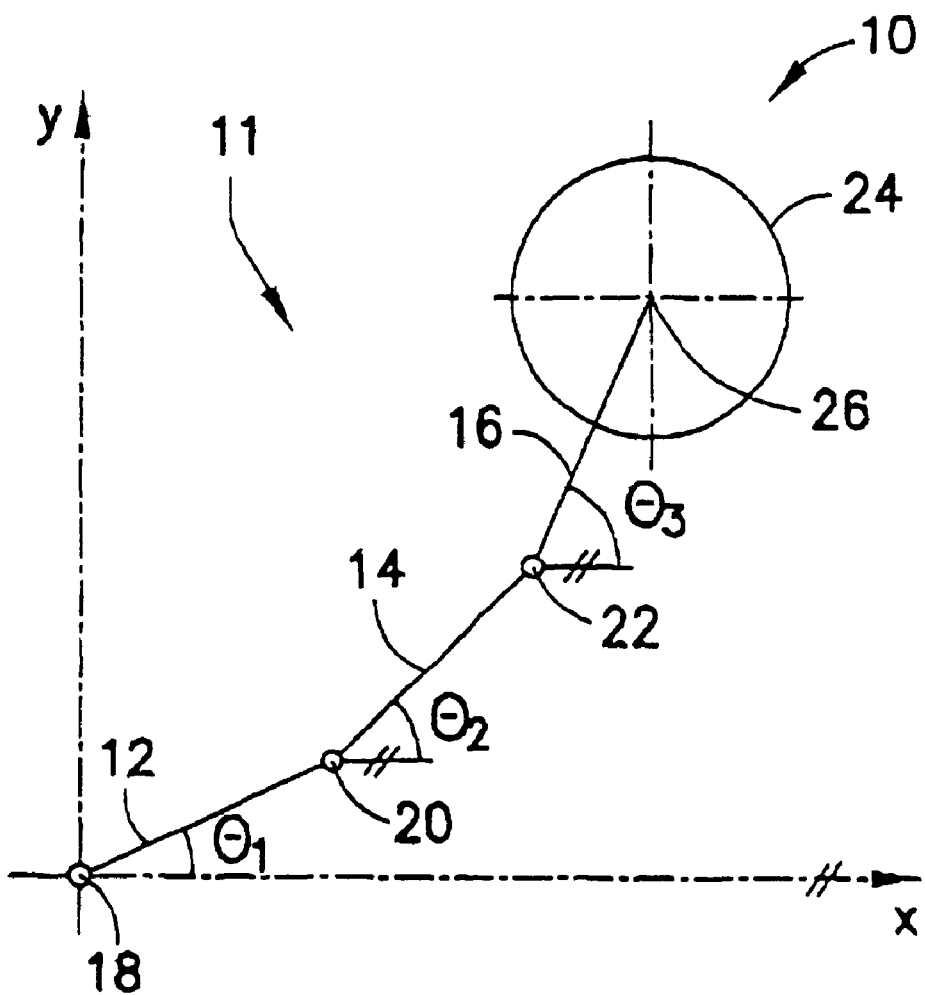
FIG. 1 is a schematic of a robotic manipulator upon which an embodiment of the present invention can be implemented.

Referring to FIG. 1, a diagrammatic view of a system 10 incorporating features of the present invention is illustrated. Although the present invention will be described with reference to the embodiment shown in the drawings, it should be understood that the present invention can be embodied in many alternate forms of embodiments. In addition, any suitable size, shape or type of elements or materials could be used.

As shown in FIG. 1, the system 10 generally comprises trajectory planning and motion control strategies for a planar three-degree-of-freedom (3DOF) robot arm 11 having a three-link mechanism, as depicted schematically in FIG. 1. The trajectory planning strategy is a sequence of steps for determining a trajectory for moving a robotic end-effector 16 from an initial position to a specified destination position. Trajectory generally refers to a motion, or transfer, path accompanied by motion profiles that describe the motion (translation and rotation) of the end-effector 16 along this motion path.

The trajectory planning strategy includes generating a motion path which simultaneously translates and rotates the end-effector around a reference point selected on the end-effector. The motion, or transfer, path is a line or curve in space along which the reference point on the end-effector is moved. The trajectory planning strategy also can generate a motion path for a robotic manipulator for access to non-radial tool stations with the use of a via point.

In addition, the trajectory planning strategy can calculate motion profiles for robot actuators which move the members of the robotic manipulator so that a smooth non-stop motion of the reference point on the end-effector along the desired motion path is achieved. Motion profiles are represented by a set of position, velocity and acceleration values that describe the motion (translation and rotation) of the end-effector 16 along the motion path as a function of time.

The motion profiles generated by the trajectory planning strategy are employed by the motion control method to determine the torques necessary for the robot actuators so that that the robot actuators track the desired motion profiles. In one embodiment, the robotic manipulator includes a main controller and a remote controller for controlling the independent actuators used for moving the robotic manipulator. While a main controller and a remote controller have been shown, the present invention is not so limited, as the trajectory planning strategies can also be employed with a single controller, as shown in FIG. 4, without departing from the broader aspects of the present invention.

The system 10 includes an upper arm 12, forearm 14 and end-effector 16 which are coupled by revolute joints 18, 20, 22. The end-effector 16 can carry a payload 24, such as a circular substrate 24. The revolute couplings 18, 20, 22 are referred to as the shoulder 18, elbow 20 and wrist joints 22, respectively. The end-effector 16 can be independently rotatable with respect to the upper arm 12 and forearm 14 of the robotic manipulator 11. The end-effector 16 can include a selected reference point 26. In this particular case, the reference point 26 can be selected to coincide with the center of the circular payload 24. The upper arm 12 and forearm 14 are typically designed to be of an equal length, allowing the wrist joint 22 to move over the shoulder joint 18. The angular orientations of the upper arm 12 and forearm 14 are denoted as $\theta_1$ and $\theta_2$, respectively. The position of the end-effector 16 in the plane of operation is defined by x, y-coordinates of the reference point 26 and by angular orientation $\theta_3$.

Figure 2:
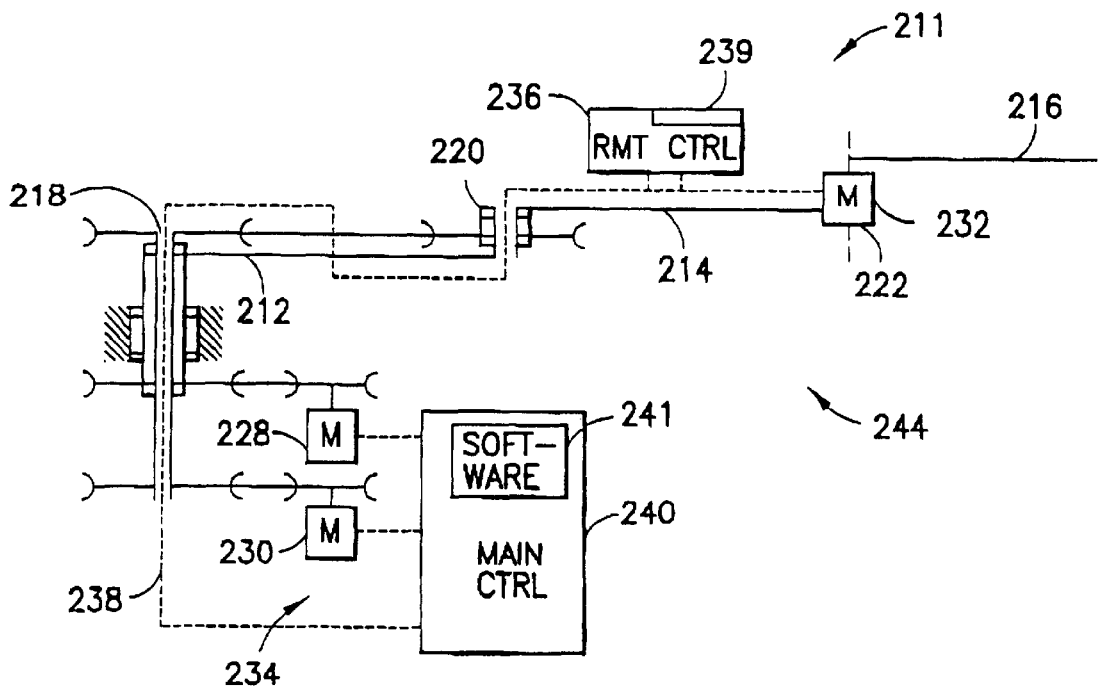
FIG. 2 is a diagram of an embodiment of an arrangement of actuators and controllers for a robotic manipulator of the present invention.
Figure 3:
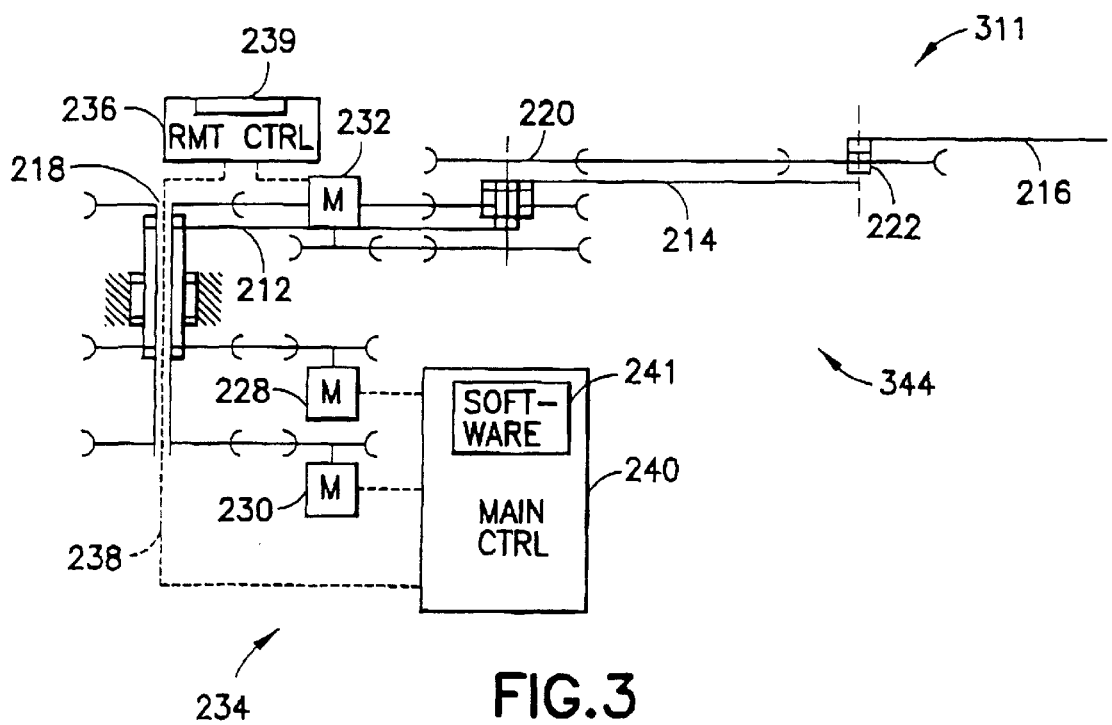
FIG. 3 is a diagram of an embodiment of an arrangement of actuators and controllers for a robotic manipulator of the present invention.
Figure 4:
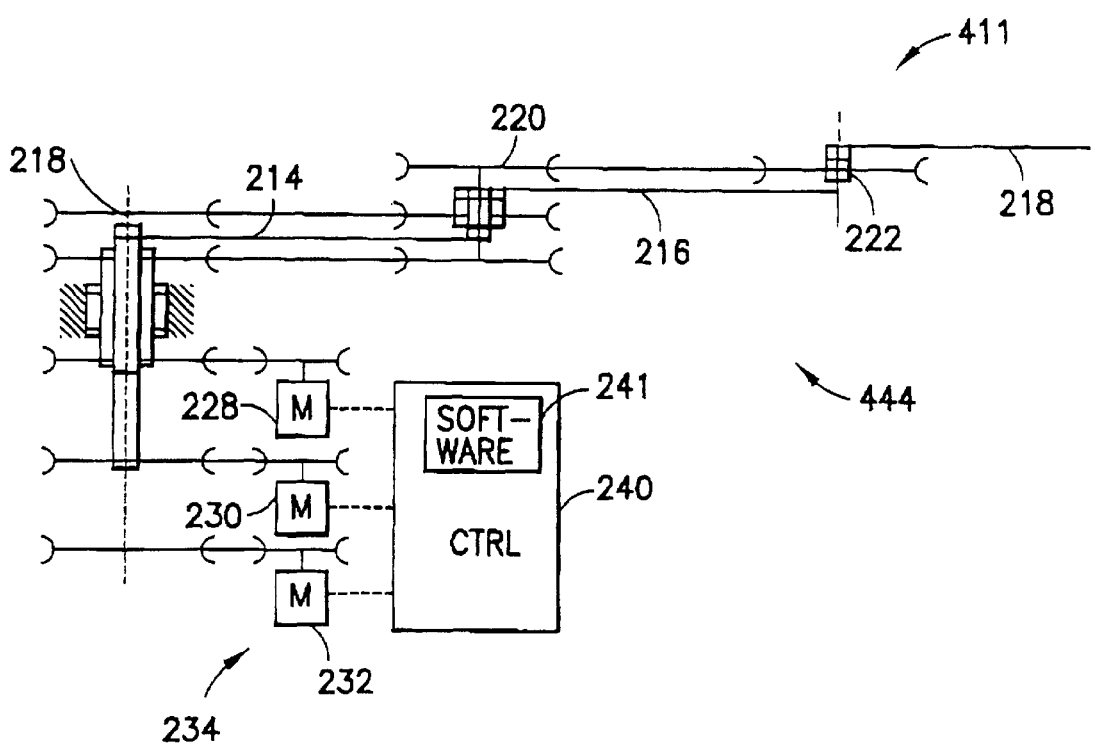
FIG. 4 is a diagram of an arrangement of actuators and a controller for a robotic manipulator for an embodiment of the present invention.

As shown in FIGS. 2, 3 and 4, the upper arm 212, forearm 214 and end-effector 216 are driven by three independent actuators 228, 230, 232, or motors M. Three locations for the independent actuator 232 are considered. FIG. 2 shows a robotic manipulator 211 with the independent actuator 232 located directly at the wrist joint 222. FIG. 3 shows a robotic manipulator 311 with the independent actuator 232 located in the upper arm 212, and FIG. 4 shows a robotic manipulator 411 with the independent actuator 232 located at a robot base 234.

Continuing with FIGS. 2, 3 and 4, distributed control architecture is an arrangement in which several controllers 236, 240 of the robotic manipulator 211 are distributed throughout the robotic manipulator 211 to be close to the motors 228, 230, 232 that they 236, 240 control. As shown in FIG. 4, centralized control architecture is an arrangement in which all of the motors 228, 230, 232 of the robotic manipulator 211 are controlled by a single central controller 240. If some of the motors 228, 230, 232 are located inside the robot arm 211 to eliminate complicated belt drives, large numbers of encoder and motor signals need to be fed through the links 212, 214 and joints 218, 220 of the robotic arm 211. As shown in FIGS. 2 and 3, a remote controller 236 connected to independent actuator 232 is an option which reduces the number of signal lines 236 going from a main controller 240 through the joints 218, 220 of the robot arm 211, 311.

Referring to FIGS. 2 and 3, the trajectory planning strategy is complemented by a motion control system of distributed type. Generally, motion control determines commanded torques, as described later, for the robot actuators 228, 230, 232 so that the robot actuators 228, 230, 232 track the desired motion profiles generated by the trajectory planning method. As shown in FIGS. 2 and 3, a distributed type of motion control strategy is preferably employed in which a control system 244, 344 comprises a pair of controllers 236, 240 that are referred to as the main controller 240 and the remote controller 236.

The main controller 240 is in charge of overall trajectory planning, and performs feedback control of the upper arm 212 and the forearm 214. The remote controller 236 is installed inside the robotic manipulator 211, 311 to control the actuator 232 associated with the end-effector 216, thus reducing the number of signal lines 238 fed through links 212, 214 and the joints 218, 220 of the robotic arm 211, 311, and reducing the length of signal lines between the actuator 232 and the controller which controls the actuator 232 (controller 236 vs. 240). A software module 241 is implemented in the main controller 240 and another software module 239 in the remote controller 236 for implementing the trajectory planning and motion control algorithms. The trajectory is formed from a combination of a translation of the reference point 26 and substantially simultaneous rotation of the end-effector 216 with respect to the reference point 26 for movement of the end-effector 216 to a predetermined location with a specified orientation.

The two controllers 236, 240 are connected through a communication line 238 that is used for transmission of trajectory information. The communication line 238 cannot be utilized for transmission of run-time data due to the limited speed of the communication line 238 and reliability related concerns. The motion control strategy accounts for dynamic coupling between the members 212, 214, 216 of the robot manipulator 211 and addresses synchronization issues between the two controllers 236, 240 through a trigger signal without sharing run-time data between the two controllers 236, 240. The typical distributed control approaches, such as independent joint-based feedback loops, either do not account for dynamic coupling and do not achieve accurate synchronization of individual controllers or utilize high-speed communication networks to share run-time data.

Figure 24:
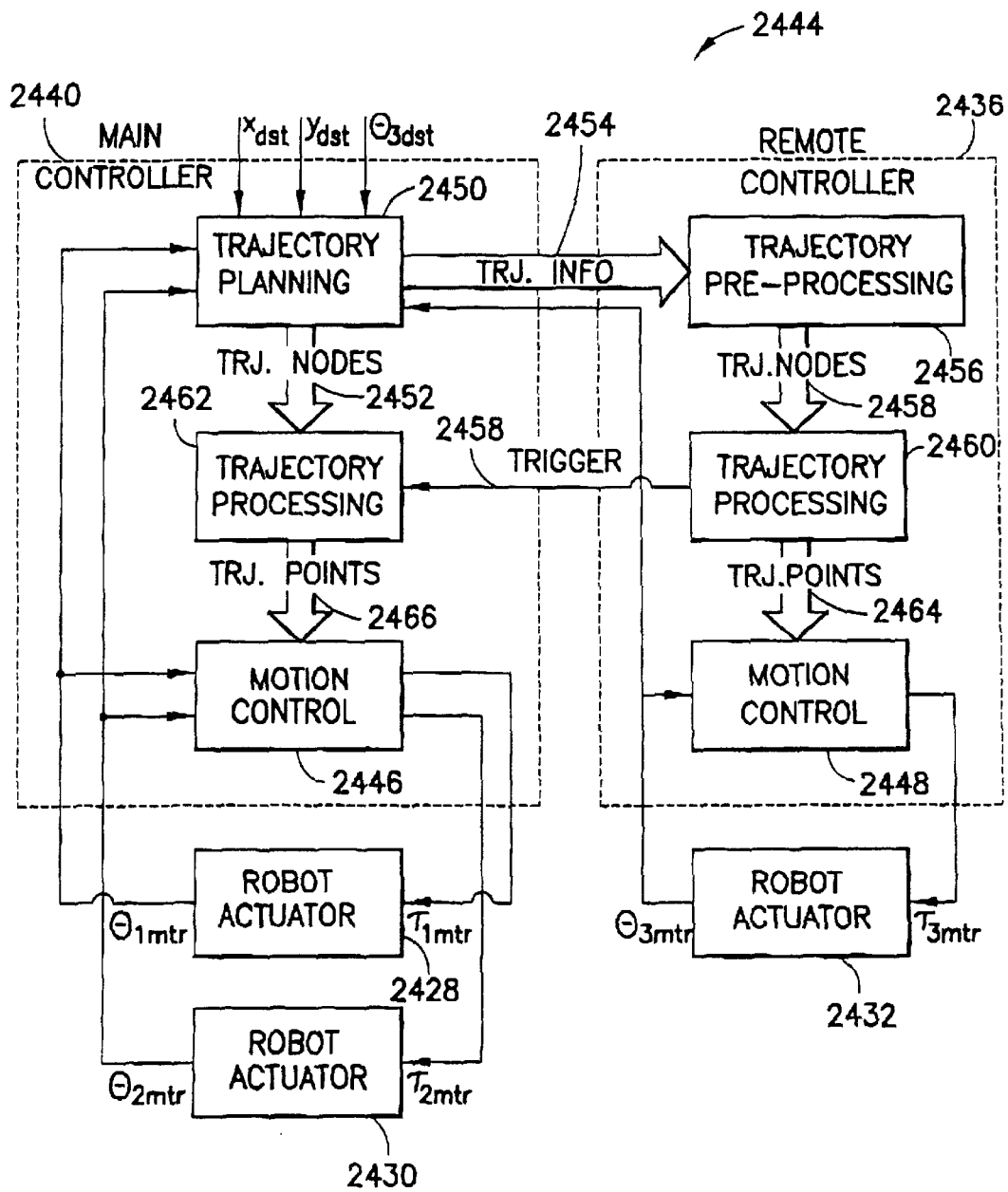
FIG. 24 is a block diagram of an embodiment of the present invention illustrating the architecture of controllers.

Referring to FIGS. 2, 3, and 24, an embodiment of a distributed type control system 2444 for the robotic manipulator 211, 311, and an implementation of a motion control strategy, is shown. The motion control strategy accounts for dynamic coupling between members 212, 214, 216 of the robotic manipulator 211, 311 and achieves synchronized operation of the two controllers 236, 240, 2436, 2440 despite the lack of communication of run-time information between the two controllers 236, 240, 2436, 2440. In a step 2450, the main controller 240, 2440 generates nodal points of motion profiles for translation and rotation of the end-effector 216, and, in a step 2452, stores the nodal points for local use. Nodal points are described in reference to FIG. 14. In a step 2454, the main controller 240, 2440 sends the nodal points in an encrypted data format to the remote controller 236, 2436. The encrypted data format allows for quicker data transmission between the main controller 240, 2440 and the remote controller 236, 2436 by compressing the amount of nodal point data which is to be transmitted. In a step 2456, the remote controller 236, 2436 pre-processes the encrypted data to reconstruct the nodal points.

Continuing with FIGS. 2, 3 and 24, in a step 2458, the remote controller 236, 2436 sends a trigger signal to the main controller 240, 2440 to, in steps 2460 and 2462, synchronously initiate run-time calculations of the motion profiles by each of the controllers 236a 240, 2436, 2440. During the run-time calculations, each of the controllers 236, 240, 2436, 2440 separately determines the desired trajectory points, including position, velocity and acceleration for all of the actuators 228, 230, 232, 2428, 2430, 2432 through inverse kinematic equations of the robot manipulator 211.

Referring to FIGS. 2, 3 and 24, and in steps 2464, 2466, the trajectory points are fed to feedback motion controllers 2446, 2448 that operate based on a modified computed-torque method to account for dynamic coupling between the members 212, 214, 216 of the robotic manipulator 211. For information which may be of interest, see Craig, J. J., "Introduction to Robotics—Mechanics and Control, (Addison-Wesley 1986) and Fu, K. S. et al., "Robotics: Control, Sensing, Vision, and Intelligence", (McGraw-Hill 1987), which are hereby incorporated by reference. The feedback motion controllers 2446, 2448 provide commands to the robot actuators 228, 230, 232, 2428, 2430, 2432 to drive the upper arm 212, forearm 214 and end-effector 216 of the robotic manipulator 211, 311.

In the computed-torque method, the control law can be viewed in terms of two fundamental parts: a model-based portion complemented by an error-driven compensator. The model-based portion employs a dynamic model of the robotic manipulator 211, 311, as described later, to linearize and decouple the rigid-body dynamics of the robot 211, 311 so that it can be represented by a pair of independent unit inertia moments associated with the motors 228, 230, 232, 2428, 2430, 2432 subject to control. The error-driven portion of the control law comprises a standard feedback compensator, e.g., PID, for each of the motors 228, 230, 232, 2428, 2430, 2432. In the conventional computed-torque method, the control torques are produced according to the following equations:

$$\{\tau\} = [M(\theta_1, \theta_2, \theta_3)]\{u\} + [h(\theta_1, \theta_2, \theta_3)]\{\dot{\theta}^2\} \tag{0}$$

where $\{u\} = \{u_1\ u_2\ u_3\}^T$, $u_i$ representing the combined output of the feedback compensator and commanded acceleration for the joint associated with motor i, i=1, 2, 3. The position-dependent matrices [M] and [h] are defined in Eqs. 17–22.

In contrast to the conventional computed-torque method, since no run-time data are shared by the two controllers 236, 240, 2436, 2440 in the present strategy, the actual position and velocity of the end-effector 216 in Eq. (0) are replaced by the commanded values on the main controller 240, 2440, and the actual positions and velocities of the upper arm 212 and forearm 214 are substituted by the commanded values on the remote controller 236, 2436. The commanded torques of the motors 228, 230, 232, 2428, 2430, 2432 that drive the robot arm 211, 311 can be obtained from the joint torques $\{\tau\}$ through a transformation that needs to reflect the actual motor arrangement in the particular mechanical design at hand (see FIGS. 2 and 3).

Figure 5:
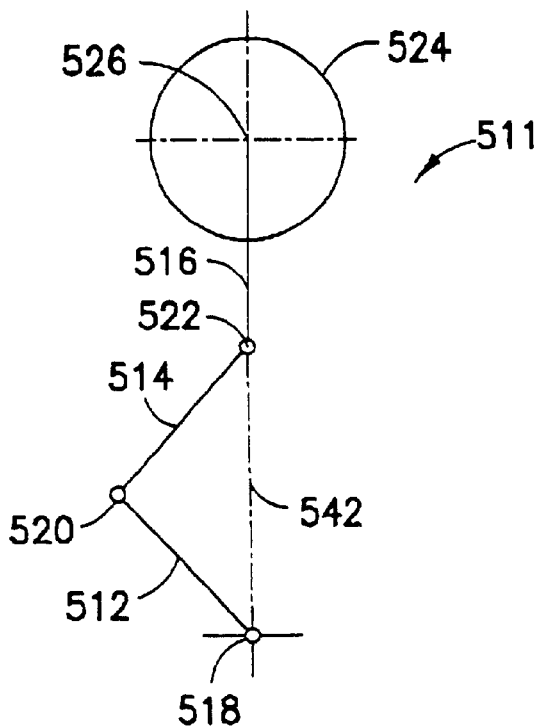
FIG. 5 is a diagram of a robotic manipulator showing a left-handed configuration.
Figure 6:
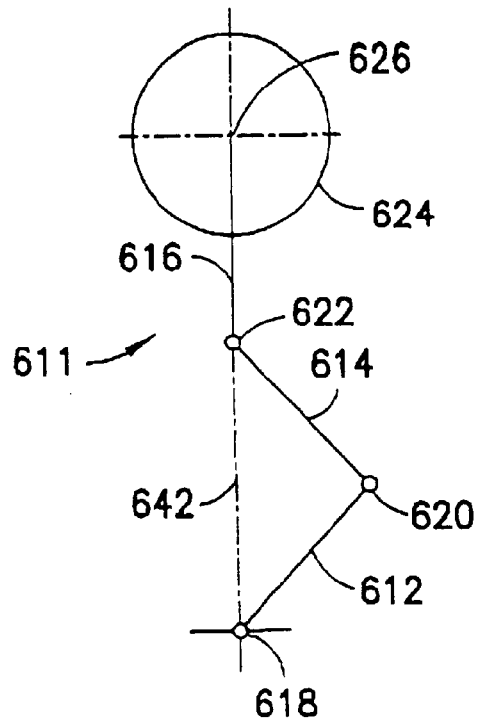
FIG. 6 is a diagram of a robotic manipulator showing a right-handed configuration.

Referring to FIG. 1, the x, y and $\theta_3$ coordinates shown in FIG. 1 uniquely define a location of the end-effector 16 in the plane of operation. However, as shown in FIGS. 5 and 6, any given position of an end-effector 516, 616 can be achieved through two different configurations of an upper arm 512, 612 and a forearm 514, 614, namely in a left-handed mode as shown in FIG. 5 or the right-handed mode as shown in FIG. 6. The left-handed and right-handed terminology is particularly convenient and intuitive when the end-effector 516, 616 points in the radial direction with respect to the shoulder joint 518, 618, as illustrated in FIGS. 5 and 6. Referring to FIG. 5, in the left-handed configuration, when looking at the robotic arm 511 in the direction of the end-effector 516, the elbow joint 520 is located to the left of a line 542 that connects the shoulder joint 518 and wrist joint 522. Referring to FIG. 6, in the right-handed configuration, an elbow joint 620 is located on the right-hand side of a similarly configured line 642.

Figure 7:
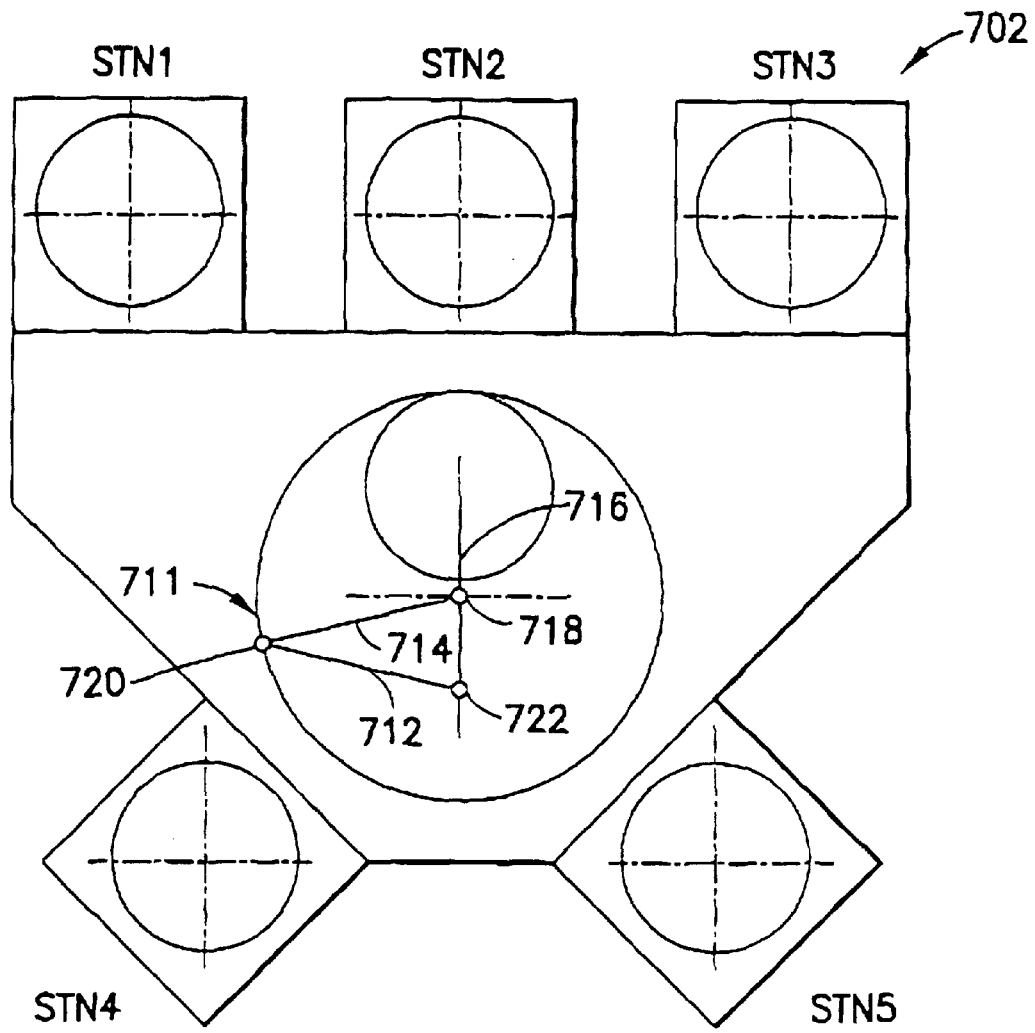
FIG. 7 is a diagram of workstations and an embodiment of a robotic manipulator of the present invention.

For the sake of simplicity, it is assumed that the primary configuration of the robotic arm 511 is left-handed, i.e., the robot always homes and retracts so that the upper arm 512 and the forearm 514 end up in a left-handed arrangement, as shown in FIG. 5. Moreover, as shown in FIG. 7, a retracted position of a robotic arm 711 is defined so that a wrist joint 722 is retracted beyond a shoulder joint 718 with an end-effector 716 pointing radially over the shoulder joint 718.

The following terms and concepts in Table 1 are used in describing the trajectory planning and motion control strategies and in related equations.

TABLE 1

NOMENCLATURE

| | | |
|---|---|---|
| a | normalized acceleration | $(1/s^2)$ |
| $a_{ang}$ | angular acceleration of end-effector | $(rad/s^2)$ |
| $a_{angA}$ | angular acceleration of end-effector 2516 | $(rad/s^2)$ |
| $a_{angB}$ | angular acceleration of end-effector 2517 | $(rad/s^2)$ |
| $a_{ang lim}$ | maximum allowable angular acceleration of end-effector | $(rad/s^2)$ |
| $a_{ang lim A}$ | maximum allowable angular acceleration of end-effector 2516 | $(rad/s^2)$ |
| $a_{ang lim B}$ | maximum allowable angular acceleration of end-effector 2517 | $(rad/s^2)$ |
| $a_{ang max}$ | maximum adjusted angular acceleration of end-effector | $(rad/s^2)$ |
| $a_{max}$ | maximum allowable normalized acceleration | $(1/s^2)$ |
| $a_{trn}$ | Translational acceleration of end-effector | $(m/s^2)$ |
| $a_{trn lim}$ | maximum allowable translational acceleration of end-effector | $(m/s^2)$ |
| $a_{trn max}$ | maximum adjusted translational acceleration of end-effector | $(m/s^2)$ |
| d | normalized jerk rate | $(1/s^4)$ |
| $d_{ang lim}$ | maximum allowable angular jerk rate of end-effector | $(rad/s^4)$ |
| $d_{ang lim A}$ | maximum allowable angular jerk rate of end-effector 2516 | $(rad/s^4)$ |
| $d_{ang lim B}$ | Maximum allowable angular jerk rate of end-effector 2517 | $(rad/s^4)$ |
| $d_{ang max}$ | Maximum adjusted angular jerk rate of end-effector | $(rad/s^4)$ |
| $d_{max}$ | Maximum allowable normalized jerk rate | $(1/s^4)$ |
| $d_{trn lim}$ | Maximum allowable translational jerk rate of end-effector | $(m/s^4)$ |
| $d_{trn max}$ | Maximum adjusted translational jerk rate of end-effector | $(m/s^4)$ |
| $I_1$ | Inertia moment of upper arm with respect to joint 18 | $(kgm^2)$ |
| $I_2$ | Inertia moment of forearm with respect to joint 20 | $(kgm^2)$ |
| $I_3$ | Inertia moment of end-effector with respect to joint 22 | $(kgm^2)$ |
| $I_A, I_B$ | Inertia moment of end-effector 2516, 2517 | $(kgm^2)$ |
| j | Normalized jerk | $(1/s^3)$ |
| $j_{ang lim}$ | Maximum allowable angular jerk of end-effector | $(rad/s^3)$ |
| $j_{ang lim A}$ | maximum allowable angular jerk of end-effector 2516 | $(rad/s^3)$ |
| $j_{ang lim B}$ | maximum allowable angular jerk of end-effector 2517 | $(rad/s^3)$ |
| $j_{ang max}$ | maximum adjusted angular jerk of end-effector | $(rad/s^3)$ |
| $j_{max}$ | maximum allowable normalized jerk | $(1/s^3)$ |
| $j_{trn lim}$ | maximum allowable translational jerk of end-effector | $(m/s^3)$ |

TABLE 1-continued

NOMENCLATURE

| | | |
|---|---|---|
| $j_{trn max}$ | maximum adjusted translational jerk of end-effector | $(m/s^3)$ |
| $l_1$ | length of upper arm (joint 18 to joint 20) | (m) |
| $l_2$ | length of forearm (joint 20 to joint 22) | (m) |
| $l_3$ | length of end-effector (joint 22 to point 26) | (m) |
| $l_{g1}$ | distance from joint 18 to center of gravity of upper arm | (m) |
| $l_{g2}$ | distance from joint 20 to center of gravity of forearm | (m) |
| $l_{g3}$ | distance from joint 22 to center of gravity of end-effector | (m) |
| $l_{gA}, l_{gB}$ | distance from wrist joint to center of gravity of end-effector 2516, 2517 | (m) |
| $m_1$ | mass of upper arm | (kg) |
| $m_2$ | mass of forearm | (kg) |
| $m_3$ | mass of end-effector | (kg) |
| $m_A, m_B$ | mass of end-effector 2516, 2517 | (kg) |
| s | normalized position | |
| $s_{ang}$ | angular position of end-effector | (rad) |
| $s_{angA}$ | angular position of end-effector 2516 | (rad) |
| $s_{angB}$ | angular position of end-effector 2517 | (rad) |
| $s_{ang max}$ | angular travel distance | (rad) |
| $s_{ang maxA}$ | angular travel distance for end-effector 2516 | (rad) |
| $s_{ang maxB}$ | angular travel distance for end-effector 2517 | (rad) |
| $s_{trn}$ | translational position of end-effector | (m) |
| $s_{trn max}$ | translational travel distance | (m) |
| v | normalized velocity | $(1/s)$ |
| $v_{ang}$ | angular velocity of end-effector | $(rad/s)$ |
| $v_{angA}$ | angular velocity of end-effector 2516 | $(rad/s)$ |
| $v_{angB}$ | angular velocity of end-effector 2517 | $(rad/s)$ |
| $v_{ang lim}$ | maximum allowable angular velocity of end-effector | $(rad/s)$ |
| $v_{ang lim A}$ | maximum allowable angular velocity of end-effector 2516 | $(rad/s)$ |
| $v_{ang lim B}$ | Maximum allowable angular velocity of end-effector 2517 | $(rad/s)$ |
| $v_{ang max}$ | Maximum adjusted angular velocity of end-effector | $(rad/s)$ |
| $v_{max}$ | Maximum allowable normalized velocity | $(1/s)$ |
| $v_{trn}$ | Translational velocity of end-effector | $(m/s)$ |
| $v_{trn lim}$ | Maximum allowable translational velocity of end-effector | $(m/s)$ |
| $v_{trn max}$ | Maximum adjusted translational velocity of end-effector | $(m/s)$ |
| $x_{dst}$ | Destination x-coordinate of reference point of end-effector | (m) |
| $y_{dst}$ | Destination y-coordinate of reference point of end-effector | (m) |
| $\theta_1$ | Angular orientation of upper arm | (rad) |
| $\theta_2$ | Angular orientation of forearm | (rad) |
| $\theta_3$ | Angular orientation of end-effector | (rad) |
| $\theta_{3dst}$ | Destination angular orientation of end-effector | (rad) |
| $\theta_{i\ mtr}$ | Angular position of motor i | (rad) |
| $\theta_{1max}$ | Maximum allowable angular velocity of upper arm | $(rad/s)$ |
| $\theta_{2max}$ | Maximum allowable angular velocity of forearm | $(rad/s)$ |
| $\tau_i$ | Torque for link i | (Nm) |
| $\tau_{i\ mtr}$ | Commanded torque for motor i | (Nm) |

Referring to FIG. 1, the relation between motion of the robotic joints 18, 20, 22 and the motion of the end-effector 16 is essential for trajectory planning purposes. Direct kinematics can be used for the conversion of angular positions, velocities and accelerations at the robotic joints 18, 20, 22 to the end-effector coordinates. Direct kinematics of the robotic manipulator 11 can be expressed in the following equations.

$$x = l(c_1 + c_2) + l_3 c_3 \quad (1)$$

$$y = l(s_1 + s_2) + l_3 s_3 \quad (2)$$

$$\dot{x} = -l(\dot{\theta}_1 s_1 + \dot{\theta}_2 s_2) - l_3 \dot{\theta}_3 s_3 \quad (3)$$

$$\dot{y} = +l(\dot{\theta}_1 c_1 + \dot{\theta}_2 c_2) + l_3 \dot{\theta}_3 c_3 \quad (4)$$

$$\ddot{x} = -l(\theta_1 s_1 + \dot{\theta}_1^2 c_1 + \ddot{\theta}_2 s_2 + \dot{\theta}_2^2 c_2) - l_3(\ddot{\theta}_3 s_3 + \dot{\theta}_3^2 c_3) \quad (5)$$

$$\ddot{y} = +l(\ddot{\theta}_1 c_1 - \dot{\theta}_1^2 s_1 + \ddot{\theta}_2 c_2 - \dot{\theta}_2^2 s_2) - l_3(\ddot{\theta}_3 c_3 - \dot{\theta}_3^2 s_3) \quad (6)$$

where:

$$c_i = \cos \theta_i; \, s_i = \sin \theta_i, \, i=1, 2, 3 \quad (7)$$

In the equations, l denotes the length of the upper arm 12 and forearm 14, $l_3$ stands for the length of the end-effector 16, and symbols "" and "" indicate the first and second time derivatives, respectively.

Inverse kinematics of the three-link robotic manipulator 11 includes the conversion of the position, velocity and acceleration in terms of the end-effector coordinates to angular positions, velocities and accelerations at the robotic joints 18, 20. Inverse kinematics of the three-link robotic manipulator 711 can be represented by the following equations.

$$\theta_1 = \operatorname{atan} \frac{y - l_3 s_3}{x - l_3 c_3} - \operatorname{acos} \frac{\sqrt{(x - l_3 c_3)^2 + (y - l_3 s_3)^2}}{2l} \quad (8)$$

$$\theta_2 = \operatorname{atan} \frac{y - l_3 s_3}{x - l_3 c_3} + \operatorname{acos} \frac{\sqrt{(x - l_3 c_3)^2 + (y - l_3 s_3)^2}}{2l} \quad (9)$$

$$\dot{\theta}_1 = +[(\dot{x} + l_3 \dot{\theta}_3 s_3)c_2 + (\dot{y} - l_3 \dot{\theta}_3 c_3)s_2]/d \quad (10)$$

$$\dot{\theta}_2 = -[(\dot{x} + l_3 \dot{\theta}_3 s_3)c_1 + (\dot{y} - l_3 \dot{\theta}_3 c_3)s_1]/d \quad (11)$$

$$\ddot{\theta}_1 = +\{[\ddot{x} + l_3(\ddot{\theta}_3 s_3 + \dot{\theta}_3^2 c_3)]c_2 + [\ddot{y} - l_3(\ddot{\theta}_3 c_3 - \dot{\theta}_3^2 s_3)]s_2 + l[\dot{\theta}_1^2(s_1 s_2 + c_1 c_2) + \dot{\theta}_2^2]\}/d \quad (12)$$

$$\ddot{\theta}_2 = -\{[\ddot{x} + l_3(\ddot{\theta}_3 s_3 + \dot{\theta}_3^2 c_3)]c_1 + [\ddot{y} - l_3(\ddot{\theta}_3 c_3 - \dot{\theta}_3^2 s_3)]s_1 + l[\dot{\theta}_2^2(s_1 s_2 + c_1 c_2) + \dot{\theta}_1^2]\}/d \quad (12)$$

where:

$$d = l(c_1 s_2 - s_1 c_2) \quad (14)$$

Referring to FIG. 1, and according to Equations 8–14, when the wrist joint 22 approaches the shoulder joint 18 in a non-radial direction, the angular velocities and accelerations of the upper arm 12 and forearm 14 go to infinity as the distance between the wrist joint 22 and the shoulder joint 18 approaches zero. The configuration of the robotic manipulator 11, i.e., when the wrist joint 22 becomes aligned with the shoulder joint 18, is defined as the singular point.

Referring to various embodiments of a robotic manipulator 211, 311, 411 having selected actuator arrangements, as shown in FIGS. 2, 3 and 4, the angular positions, velocities and accelerations of the actuators 228, 230, 232 that drive the upper arm 212, forearm 214 and end-effector 216 can be obtained from the joint values through a coordinate transformation that reflects the actuator and mechanical arrangement of each robotic manipulator 211, 311, 411.

Referring to FIG. 1, a dynamic model of the robotic manipulator 11 can be determined for motion control purposes. Applying the well known Lagrangian approach, the dynamic model of the robotic manipulator 11 is obtained as:

$$\{\tau\} = [M]\{[l|\$]\$\ddot{g}\ddot{v}\} + [h]\{\dot{\theta}^2\} \quad (15)$$

where:

$$\{\tau\} = \{\tau_1 \, \tau_2 \, \tau_3\}^T, \, \{\ddot{\theta}\} = \{\ddot{\theta}_1 \, \ddot{\theta}_2 \, \ddot{\theta}_3\}^T, \, \{\dot{\theta}^2\} = \{\dot{\theta}_1^2 \, \dot{\theta}_2^2 \, \dot{\theta}_3^2\}^T \quad (16)$$

The vector $\{\tau\}$ is composed of torques which drive the three links 12, 14, 16 of the robotic manipulator 11 (typically referred to as joint torques). The elements of the matrices $[M]$ and $[h]$ are defined as follows:

$$M_{11} = I_1 + (m_2 + m_3)l^2 \quad M_{12} = (m_2 l_{g2} + m_3 l)lc_{21} \quad M_{13} = m_3 l l_{g3} c_{31} \quad (17)$$

$$M_{21} = (m_2 l_{g2} + m_3 l)lc_{21} \quad M_{22} = I_2 + m_3 l^2 \quad M_{23} = m_3 l l_{g3} c_{32} \quad (18)$$

$$M_{31} = m_3 l l_{g3} c_{31} \quad M_{32} = m_3 l l_{g3} c_{32} \quad M_{33} = I_3 \quad (19)$$

$$h_{11} = 0 \quad h_{12} = -(m_2 l_{g2} + m_3 l)ls_{21} \quad h_{13} = -m_3 l l_{g3} s_{31} \quad (20)$$

$$h_{21} = (m_2 l_{g2} + m_3 l)ls_{21} \quad h_{22} = 0 \quad h_{23} = -m_3 l l_{g3} s_{32} \quad (21)$$

$$h_{31} = m_3 l l_{g3} s_{31} \quad h_{32} = m_3 l l_{g3} s_{32} \quad h_{33} = 0 \quad (22)$$

where $I_i$, $m_i$, and $l_{gi}$, i=1, 2, 3, represent the dynamic properties of the three links 12, 14, 16 of the robotic manipulator 11, as defined in Table 1, and $c_{ij} = \cos(\theta_i - \theta_j)$, $s_{ij} = \sin(\theta_i - \theta_j)$.

Referring to FIGS. 2, 3 and 4, the torques of the actuators 228, 230, 232 that drive the robotic manipulator 211, 311, 411 can be obtained from the joint torques $\tau_i$, i=1, 2, 3, through a transformation that reflects the actuator arrangement in the particular mechanical design of the robotic manipulator 211, 311, 411.

Referring to FIGS. 2, 3 and 4, motion profiles created by the method of trajectory planning can be generated in terms of or converted into position, velocity and acceleration of the robotic actuators 228, 230, 232 and can be utilized in the robotic motion controller 240 as reference control inputs. The path planning and motion profiles for the pick-place robotic manipulator 211, 311, 411 can depend primarily on the geometry of a robotic workspace, such as a cluster tool 702 shown schematically in FIG. 7. The path planning and motion profiles for the robotic manipulator 211, 311, 411 can also depend on the particular task to be performed. Additional constraints to the motion profiles may include, for instance, the speed-torque characteristics of the robot actuators 228, 230, 232, a maximum allowable acceleration of the end-effector 216 in order to prevent payload slippage, or a maximum allowable velocity of the robotic manipulator 228, 230, 232 to comply with safety-related requirements.

Figures 8, 9:
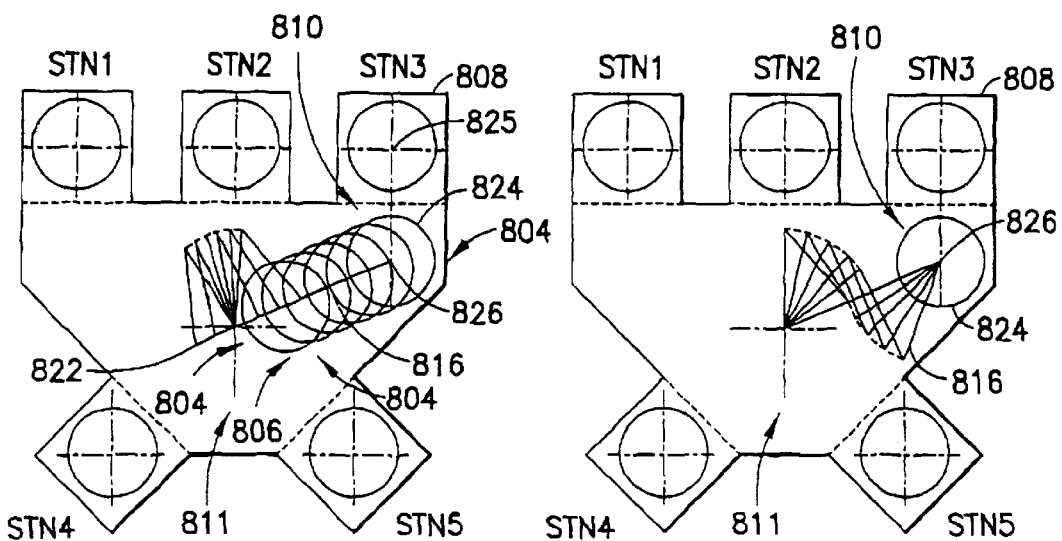
FIGS. 8 to 10 are diagrams of an embodiment of the present invention for moving a robotic manipulator to a non-radial workstation.
Figure 10:
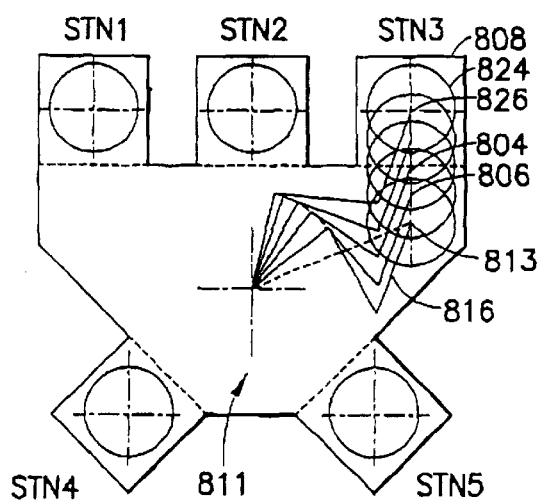

Referring to FIGS. 8, 9 and 10, in one embodiment of the present invention, a trajectory for a planar 3DOF robotic manipulator 811 is synthesized in terms of a combined translation of a reference point 826 attached to an end-effector 816 and simultaneous rotation of the end-effector 816 with respect to this reference point 826. The translational motion is decomposed into a sequence of straight-line legs 804 which can be blended into a smooth non-stop motion path 806 (blending not shown in FIGS. 8, 9 and 10). The motion path 806 is the dashed line which connects the initial position of the reference point 826 on the end-effector 816, a via point 813, and the destination point 825 in the station 808. The leg 804 of the motion path 806 is a straight line section of the motion path 806. The motion profiles along the legs 804 are controlled by a set of constraints imposed on the translational and rotational components of motion, e.g., the maximum allowable translational and rotational velocities, accelerations, jerks and jerk rates.

The motion profiles are generated in such a manner that the translational and rotational components are synchronized by starting and finishing at the same time, without violating any of the constraints. The corresponding joint motion profiles are obtained through the application of inverse kinematic equations for the mechanical arrangement of the robotic manipulator 811. The joint motion profiles are necessary for control purposes and implementing the movement of the robotic manipulator 811.

Continuing with FIGS. 8, 9 and 10, generally any motion of the end-effector 816 in a given plane of operation can be viewed as translation of a selected reference point 826 on the end-effector 816 accompanied by simultaneous rotation of the end-effector 816 with respect to this reference point 826. The problem of trajectory generation can be reduced to synthesis of a suitable path 806 for the reference point 826, and calculation of motion profiles for the translational and rotational components of motion along the selected path 806.

In semiconductor manufacturing applications, the reference point 826 can be conveniently selected to coincide with the center of a substrate, 824, such as a circular silicon wafer 824, which is a typical article subject to robotic manipulator operations. As a result, as shown in FIG. 9, whenever the end-effector 816 is commanded to change orientation, the end-effector 816 rotates with respect to the reference point 826 which is the center of the substrate 824. The substrate 824 rotates around the substrate's center 826, and remains in a stationary location, rather than the end-effector 816 rotating around the wrist joint 822 of the robotic manipulator 811 causing both a rotation and translation of the substrate 824.

The selection of the reference point 826 at the center of the substrate 824 provides additional benefits in the form of improved maneuverability when the robotic manipulator 811 is under manual control or in a station teaching mode. For instance, as shown in FIG. 8, when approaching an orthogonally oriented work station 808, the operator can command the robotic manipulator 811 to extend radially to the entrance 810 of the work station 808. As shown in FIG. 9, the robotic manipulator 811 can then change orientation of the end-effector 816, by, for example, aligning the end-effector 816 with the desired access direction, while the center 826 of the substrate 824 remains in the same position at the entrance 810 of the work station 808. As shown in FIG. 10, the end-effector 816 can be extended along a straight line path 806 with respect to the reference point 826 to place the substrate 826 in the work station 808.

Referring to FIGS. 8, 9, and 10, the trajectory planning methodology reduces the number of robotic arm movements necessary to access a non-radial work station when the robotic manipulator 811 is under manual control or in a station teaching mode. In contrast, in previous methodologies, rotational motion of the end-effector 816 with respect to the wrist joint 822 can move the substrate 824 from the original position near the entrance 810 of the work station 808. An iterative approach involving repeated translations of the robotic manipulator 811 is required to keep the substrate 824 near the original position at the entrance 810 of the work station 808 while aligning the end-effector 816 with the desired access path 806.

Figure 11:
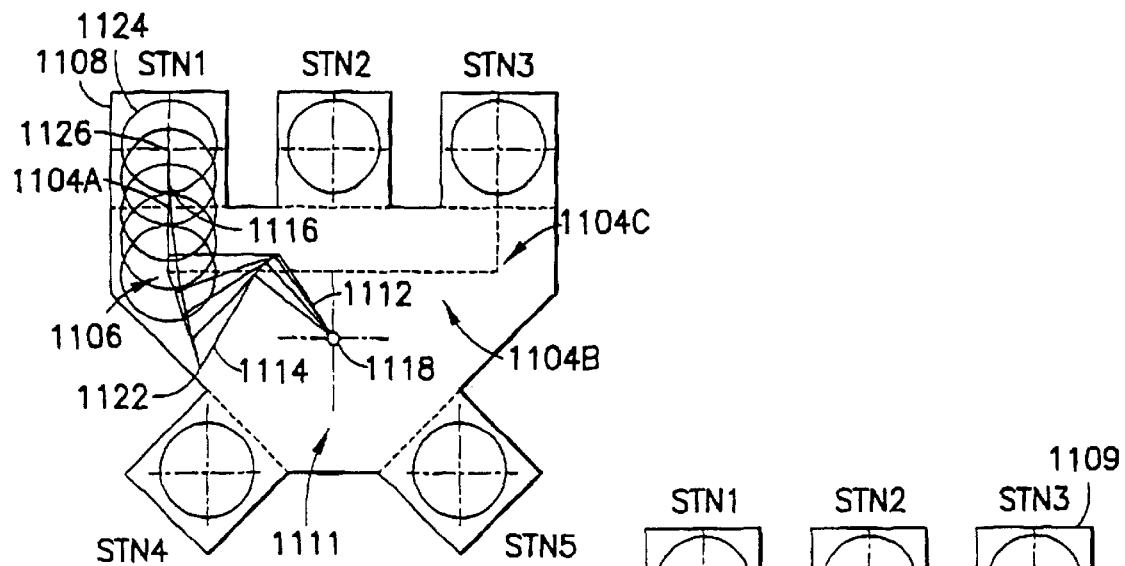
FIGS. 11 to 13 are diagrams of an embodiment of the present invention of workpiece transfer by a robotic manipulator between workstations.
Figure 12:
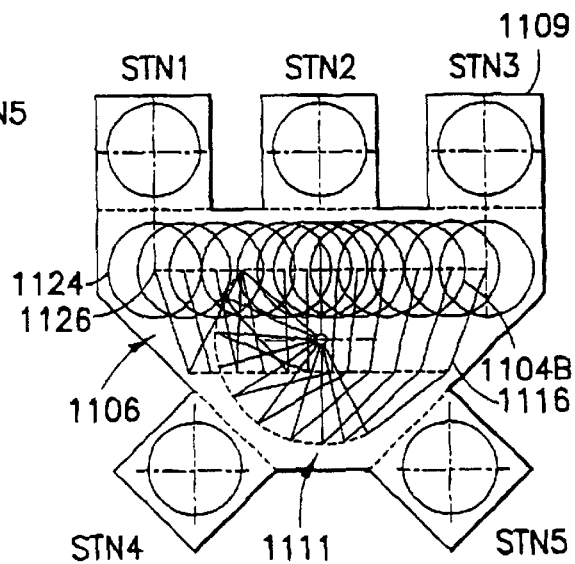
Figure 13:
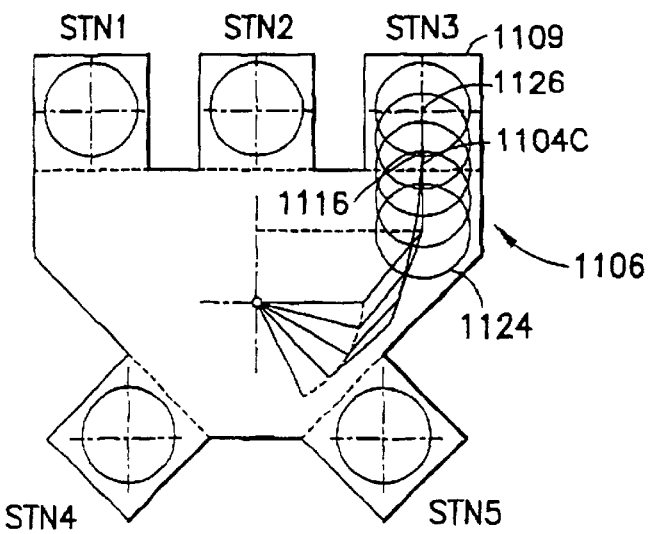

Referring to FIGS. 11, 12 and 13, a path 1106 of a reference point 1126 can be synthesized in terms of a sequence of straight-line sections 1104, or legs 1104 for typical pick-place operations in semiconductor and flat panel display (FPD) manufacturing applications. For example, as shown in FIG. 11, a robotic manipulator 1111 picks a circular substrate 1124 at a work station 1108 and moves the substrate 1124 along a straight line leg 1104a, as indicated by the changing position of a reference point 1126 on an end-effector 1116, out of the work station 1108. Referring to FIG. 12, the robotic manipulator 1111 moves the circular substrate 1124 along a straight-line leg 1104b with respect to the reference point 1126 to the front of work station 1109. As shown in FIG. 13, the circular substrate 1124 is placed into work station 1109 with a straight line leg 1104c with respect to the reference point 1126 on the end-effector 1116.

The straight-line sections 1104a, 1104b and 1104c, or legs 1104a, 1104b and 1104c, of the path 1106 can be blended into a smooth non-stop trajectory by overlapping motion profiles associated with pairs of consecutive legs 1104a, 1104b and 1104c by given time periods. This approach avoids unnecessary stops between the individual legs 1104a, 1104b and 1104c, and results in a faster overall movement of the reference point 1126 on the end-effector 1116, and an improvement in the overall travel time. U.S. Pat. No. 6,216,058, issued to Applicants, may include information in regard to a type of blending trajectory sections, and is hereby incorporated by reference.

Figure 14:
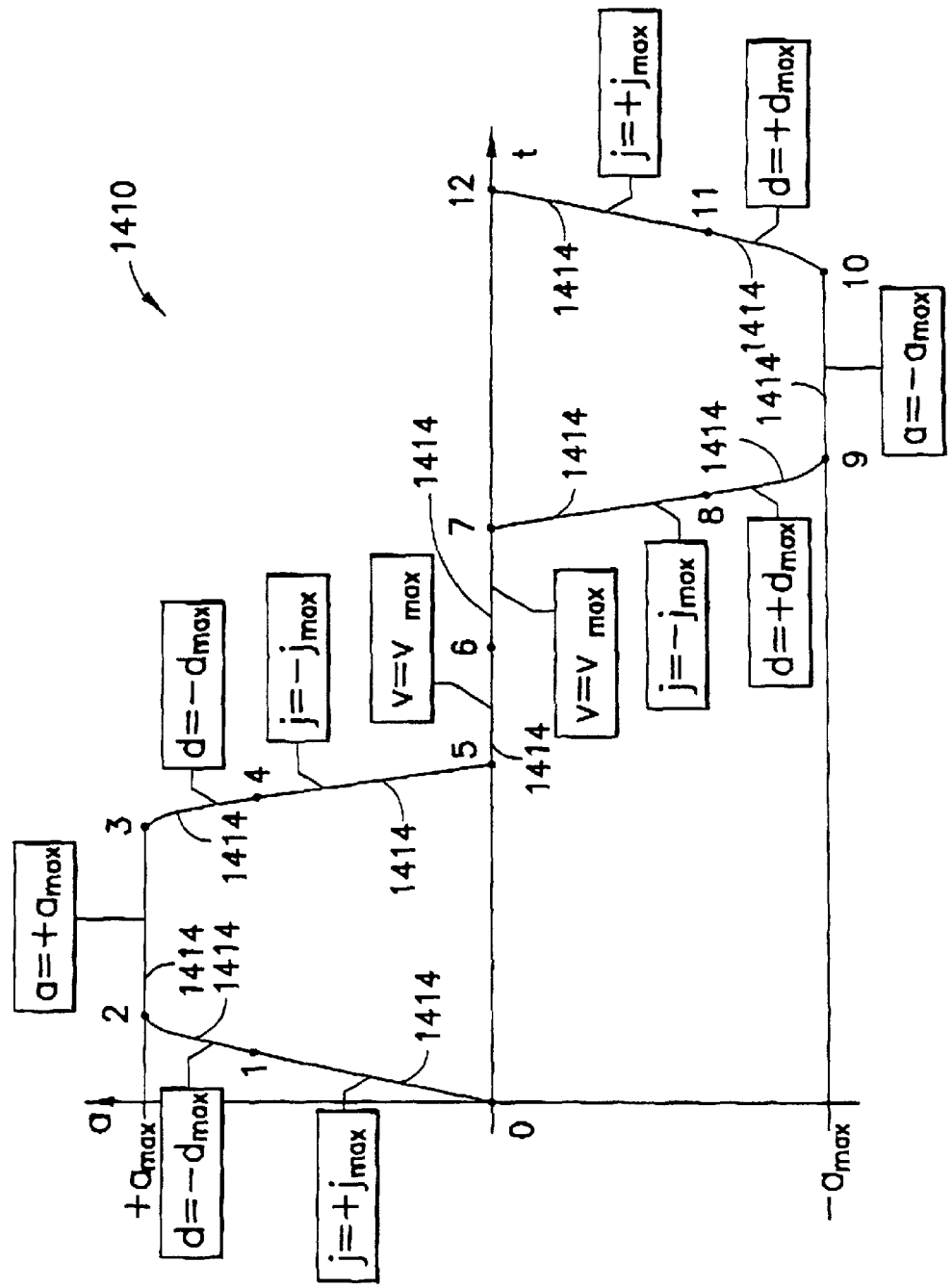
FIG. 14 is a diagram of an embodiment of a generic acceleration profile for a robotic manipulator.

Referring to FIGS. 11 and 14, motion profiles for the translational and rotational components of motion for each of the legs 1104a, 1104b and 1104c are generated after the individual legs 1104a, 1104b and 1104c of the path 1106 of the reference point 1126 are determined. The motion profiles can include position, velocity and acceleration curves for the translational and rotational components of motion of the end-effector 1116. The motion profiles can be limited by a set of constraints imposed independently on the translational and rotational components of motion, such as the maximum allowable translational and rotational velocities, accelerations, jerks and jerk rates. In general, different sets of constraints are considered for each of the legs 1104a, 1104b and 1104c.

The position, velocity and acceleration profiles for translational and rotational components along each of the legs 1104a, 1104b and 1104c can be generated independently to comply with the respective sets of constraints. See a method using pre-defined time-optimum shapes for two degree of freedom robotic manipulators, as disclosed in U.S. Pat. No. 6,216,058 by Applicants. The principal idea of this method is to select an appropriate profile from a set of pre-defined fundamental trajectory shapes which cover all possible combinations of constraints. The fundamental shapes are found as simplified versions of a generic shape which corresponds to the case when all of the constraints are active. Alternatively, the desired translational and angular positions, velocities and accelerations can be obtained by scaling a single motion profile generated for a normalized, e.g. unit, travel distance, as described later in this document.

Referring to FIGS. 11 and 14, an acceleration profile 1410 of the generic shape that applies to straight-line and rotational moves, such as straight line legs 1104a, 1104b and 1104c, is shown. Each of the pre-defined shapes is associated with a set of conditions which determine whether the shape can be used for a particular combination of travel distance and constraints. In FIG. 14, the symbols $v_{max}$, $a_{max}$, $j_{max}$ and $d_{max}$ denote maximum generalized (i.e., translational or angular) velocity, acceleration, jerk and jerk rate, respectively. The acceleration profile 1410 for a leg 1104 is composed of segments 1414 in which a single constraint is active. The segments 1414 and the respective constraints are summarized in Table 2.

TABLE 2

Segment constraints for the motion profile of FIG. 14

| Segment | Constraint |
|---------|------------|
| 0–1 | $j = +j_{max}$ |
| 1–2 | $d = -d_{max}$ |
| 2–3 | $a = +a_{max}$ |
| 3–4 | $d = -d_{max}$ |
| 4–5 | $j = -j_{max}$ |
| 5–6 | $v = v_{max}$ |
| 6–7 | $v = v_{max}$ |
| 7–8 | $j = -j_{max}$ |
| 8–9 | $d = +d_{max}$ |
| 9–10 | $a = -a_{max}$ |
| 10–11 | $d = +d_{max}$ |
| 11–12 | $j = +j_{max}$ |

As shown in Table 2, there is always one quantity (velocity, acceleration, jerk or jerk rate) kept constant in each of the segments 1414 of the leg 1104. Therefore, the entire motion profile for the leg 1104 is completely defined by a set of 13 (or less) nodal points, regardless of the length or duration of motion of the robotic manipulator 1111. The nodal points (nodes) include time, position, velocity, acceleration, jerk and jerk rate information. At any time instant, the corresponding position, velocity and acceleration of the reference point 1126 on the end-effector 1116 can be obtained from the nodal points using the following expressions:

$$a = a_i + j_i(t - t_i) + \frac{1}{2}d_i(t - t_i)^2 \quad (23)$$

$$v = v_i + a_i(t - t_i) + \frac{1}{2}j_i(t - t_i)^2 + \frac{1}{6}d_i(t - t_i)^3 \quad (24)$$

$$s = s_i + v_i(t - t_i) + \frac{1}{2}a_i(t - t_i)^2 + \frac{1}{6}j_i(t - t_i)^3 + \frac{1}{24}d_i(t - t_i)^4 \quad (25)$$

$$t \in [t_i, t_{i+1}), \; i = 0, 1, \ldots, n \quad (26)$$

where n is equal to 11 for the generic motion profile of FIG. 14. The corresponding angular positions, velocities and accelerations of the upper arm 1112 and forearm 1114 can be obtained from the translational and rotational components of motion of the end-effector 1116 through the inverse kinematic equations 8 to 14.

Referring to FIGS. 11 and 12, the translational and rotational components of motion of the end-effector 1116 can be synchronized, that is, the components of motion start and finish at the same time. The synchronization can reduce the risk of generating trajectories that would result in impossible configurations of the robotic manipulator 1111. For example, a trajectory in which the rotation of the end-effector 1116 finishes before the translation of the end-effector 1116, and that brings the wrist joint 1122 out of the reach of the upper arm 1112 and forearm 1114, would not be mechanically possible. The synchronization is achieved by generating the translational and rotational motion profiles based on modified constraints that are calculated to satisfy the following requirement:

$$\frac{s_{angmax}}{s_{trnmax}} = \frac{v_{angmax}}{v_{trnmax}} = \frac{a_{angmax}}{a_{trnmax}} = \frac{j_{angmax}}{j_{trnmax}} = \frac{d_{angmax}}{d_{trnmax}} \quad (27)$$

where $s_{trn\,max}$ and $s_{ang\,max}$ denote translational and rotational travel distances, respectively, and $v_{trn\,max}$, $v_{ang\,max}$, $a_{trn\,max}$, $a_{ang\,max}$, $j_{trn\,max}$, $j_{ang\,max}$, $d_{trn\,max}$ and $d_{ang\,max}$ are modified constraints defined in accordance with Table 1. It is imperative that the constraints are modified in such a manner that none of the original constraints imposed on the translational and rotational motion of the end-effector are violated. For instance, the modified velocity constraints are determined as follows:

$$\tilde{v}_{trn\,max} = v_{trn\,lim}, \; \tilde{v}_{ang\,max} = v_{ang\,lim} \; \text{if} \; v_{trn\,lim}|s_{ang\,max}/s_{trn\,max}| = v_{ang\,lim} \quad (28)$$

$$\tilde{v}_{trn\,max} = v_{trn\,max}, \; \tilde{v}_{ang\,max} = v_{trn\,max}|s_{ang\,max}/s_{trn\,max}| \; \text{if} \; v_{trn\,max}|s_{ang\,max}/s_{trn\,max}| < v_{ang\,max} \quad (29)$$

$$\tilde{v}_{trn\,max} = v_{ang\,max}|s_{trn\,max}/s_{ang\,max}|, \; \tilde{v}_{ang\,max} = v_{ang\,max} \; \text{if} \; v_{trn\,max}|s_{ang\,max}/s_{trn\,max}| > v_{ang\,max} \quad (30)$$

where $v_{trn\,lim}$ and $v_{ang\,lim}$ denote the original maximum allowable translational and angular velocities, respectively. The modified constraints do not violate the original constraints.

Considering Eq. 27 and Table 2, it is observed that the position, velocity and acceleration profiles obtained from Eqs. 23 to 26 for the translational and rotational components of motion are proportional. Therefore, the components can be calculated conveniently by scaling a single motion profile generated for, a normalized, or unit, travel distance. The constraints for the normalized motion profile are found as follows:

$$v_{max} = \min(|v_{trn\,lim}/s_{trn\,max}|, |v_{ang\,lim}/s_{ang\,max}|) \quad (31)$$

$$a_{max} = \min(|a_{trn\,lim}/s_{trn\,max}|, |a_{ang\,lim}/s_{ang\,max}|) \quad (32)$$

$$j_{max} = \min(|j_{trn\,lim}/s_{trn\,max}|, |j_{ang\,lim}/s_{ang\,max}|) \quad (33)$$

$$d_{max} = \min(|d_{trn\,lim}/s_{trn\,max}|, |d_{ang\,lim}/s_{ang\,max}|) \quad (34)$$

where $v_{max}$, $a_{max}$, $j_{max}$ and $d_{max}$ are a maximum normalized velocity, acceleration, jerk and jerk rate, respectively. The actual translational and rotational components of motion can be obtained from the normalized motion profile using the following expressions:

$$s_{trn} = s \times s_{trn\,max}, \; v_{trn} = v \times s_{trn\,max}, \; a_{trn} = a \times s_{trn\,max} \quad (35)$$

$$s_{ang} = s \times s_{ang\,max}, \; v_{ang} = v \times s_{ang\,max}, \; a_{ang} = a \times s_{ang\,max} \quad (36)$$

where s, v and a denote a normalized position, velocity and acceleration calculated according to Eqs. 23 to 26.

Continuing with FIGS. 11 and 12, additional constraints are provided in the form of the maximum allowable angular velocities of the upper arm 1112 and forearm 1114. These additional constraints are to prevent excessive angular velocities of the upper arm 1112 and forearm 1114 when the robotic manipulator 1111 moves in the vicinity of the singular point. As defined earlier, the singular point is the configuration of the arm when the wrist joint becomes aligned with the shoulder joint.

Excessive angular velocities of the upper arm 1112 and forearm 1114 due to the singular point can be encountered when the wrist joint 1122 of a three-link robotic manipulator 1111 moves through the vicinity of the shoulder joint 1118 in a non-radial direction. In this case, the angular velocities of the upper arm 1112 and forearm 1114 go to infinity as the distance between the wrist joint 1122 and the shoulder joint 1118 approaches zero.

Referring to FIGS. 11, 12, 15 and 16, the trajectory generation process can be modified in the following manner.

A trajectory for a straight-line motion with a synchronized rotation of the end-effector 1116 is generated. The trajectory can be computed in a normalized form, such as for a unit travel distance.

The normalized trajectory can be evaluated in a selected grid of points and checked for violation of the maximum allowable angular velocity of the forearm 1114 and upper arm 1112. For this purpose, the maximum angular velocity constraints can be converted into a position-dependent limit in terms of the normalized velocity (see Eqs. 44, 45 and 46). In this form, the normalized trajectory can be checked against the angular velocity constraints directly, i.e., without the inverse kinematics of the robotic manipulator 1111 being involved.

If the constraints are violated, the minimum value of the maximum allowable normalized velocity in the interval of violation can be determined. This value, denoted as $v_{new\ max}$ for reference, can be then taken as a new normalized velocity constraint, and the trajectory can be regenerated.

In order to maximize the average velocity, two additional motion profiles can be superposed at each end of the new trajectory (see details below). In this embodiment, the acceleration, jerk and velocity constraints for the new trajectory need to be reduced to one half, and the velocity constraint is set either to one half of the original limit $v_{max}$ or to the new value $v_{new\ max}$, whichever is smaller.

As disclosed above, two motion profiles can be superposed at each end of the new trajectory to optimize the velocity profile in the zones where the new velocity constraint $v_{new\ max}$ would be unnecessarily low. The constraints for these additional profiles can be reduced to one half so that the original limits are complied with after the superposition. The lengths of the additional profiles can be maximized to the point when the position-dependent velocity limit associated with the angular velocity constraints is reached.

In order to convert the maximum member 1112, 1114 angular velocity constraints into a position-dependent limit in terms of the normalized velocity, the inverse kinematic equations for the three-link robotic manipulator 1111 are revisited:

$$\dot{\theta}_1 = +[(v_x + l_3\dot{\theta}_3 s_3)c_2 + (v_y - l_3\dot{\theta}_3 c_3)s_2]/d \quad (37)$$

$$\dot{\theta}_2 = -[(v_x + l_3\dot{\theta}_3 s_3)c_1 + (v_y - l_3\dot{\theta}_3 c_3)s_1]/d \quad (38)$$

where $v_x$ and $v_y$ are x- and y-components of translational velocity of the end-effector 1116, respectively. In order to achieve synchronization of translation and rotation of the end-effector 1116, these x- and y-components, as well as the angular velocity of the end-effector 1116, are proportional to the normalized velocity profile:

$$v_x = k_x v,\ v_y = k_y v,\ \dot{\theta}_3 = k_3 v \quad (39)$$

Substituting these relationships into Eqs. 37 and 38 yields the following expressions for angular velocities of the upper arm 1112 and forearm 1114:

$$\dot{\theta}_1 = +[(k_x + l_3 k_3 s_3)c_2 + (k_y - l_3 k_3 c_3)s_2]v/d \quad (40)$$

$$\dot{\theta}_2 = -[(k_x + l_3 k_3 s_3)c_1 + (k_y - l_3 k_3 c_3)s_1]v/d \quad (41)$$

The angular velocities of the upper arm 1112 and forearm 1114 should remain below the maximum allowable values of $\dot{\theta}_{1\ max}$ and $\dot{\theta}_{2\ max}$:

$$\dot{\theta}_{1\ max} \geq |[(k_x + l_3 k_3 s_3)c_2 + (k_y - l_3 k_3 c_3)s_2]v/d| \quad (42)$$

$$\dot{\theta}_{2\ max} \geq |[(k_x + l_3 k_3 s_3)c_1 + (k_y - l_3 k_3 c_3)s_1]v/d| \quad (43)$$

Solving Eqs. 42 and 43 for the maximum allowable normalized velocity results in the following expressions:

$$v_1 = \dot{\theta}_{1\ max} |d/[(k_x + l_3 k_3 s_3)c_2 + (k_y - l_3 k_3 c_3)s_2]| \quad (44)$$

$$v_2 = \dot{\theta}_{2\ max} |d/[(k_x + l_3 k_3 s_3)c_1 + (k_y - l_3 k_3 c_3)s_1]| \quad (45)$$

$$v_{lim} = \min(v_1, v_2) \quad (46)$$

where $v_1$ stands for the maximum allowable normalized velocity associated with $\dot{\theta}_{1\ max}$, $v_2$ denotes the maximum allowable normalized velocity due to $\dot{\theta}_{2\ max}$, and $v_{lim}$ is the maximum allowable normalized velocity when both $\dot{\theta}_{1\ max}$ and $\dot{\theta}_{2\ max}$ are considered.

Figure 15:
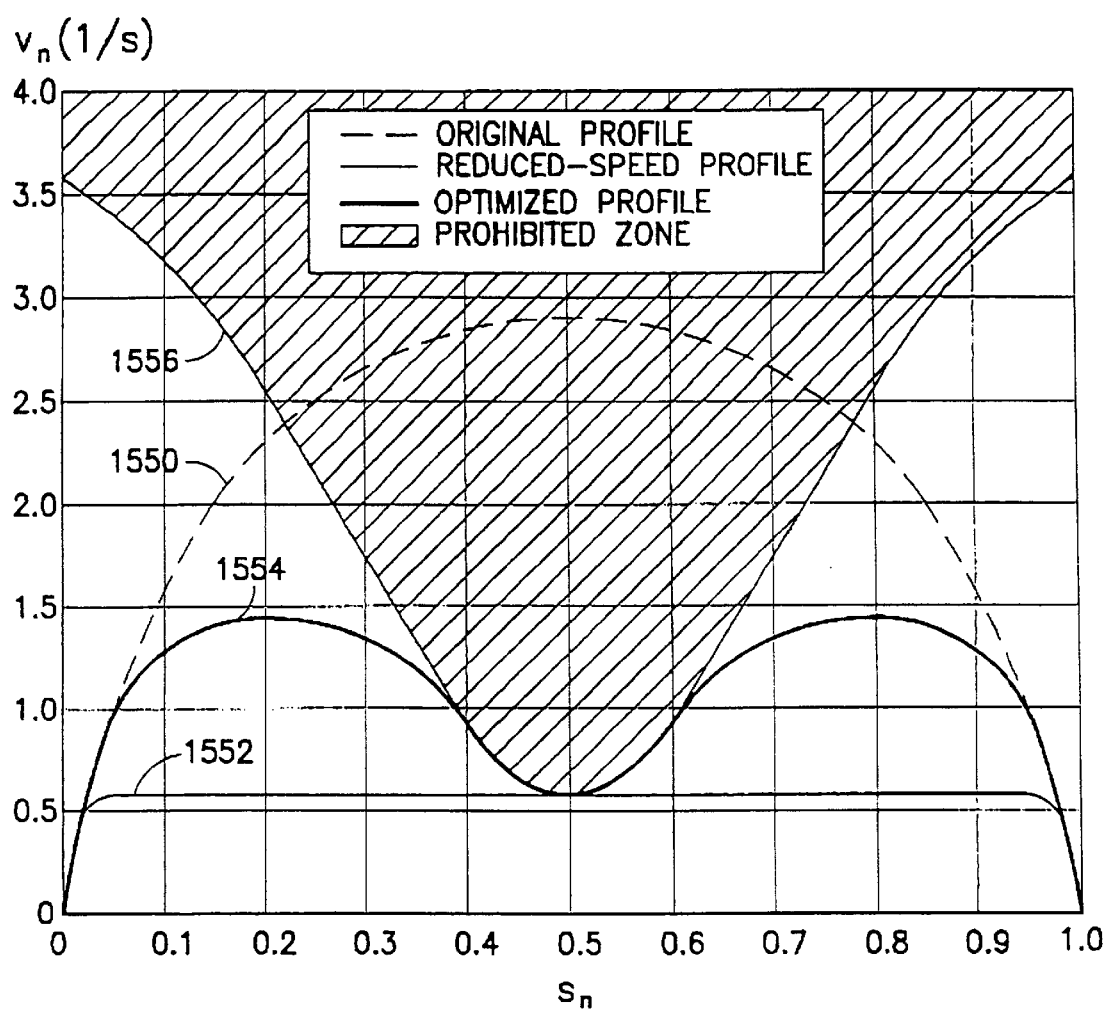
FIG. 15 is a diagram of an embodiment of a motion profile of the present invention showing normalized velocity versus normalized position.
Figure 16:
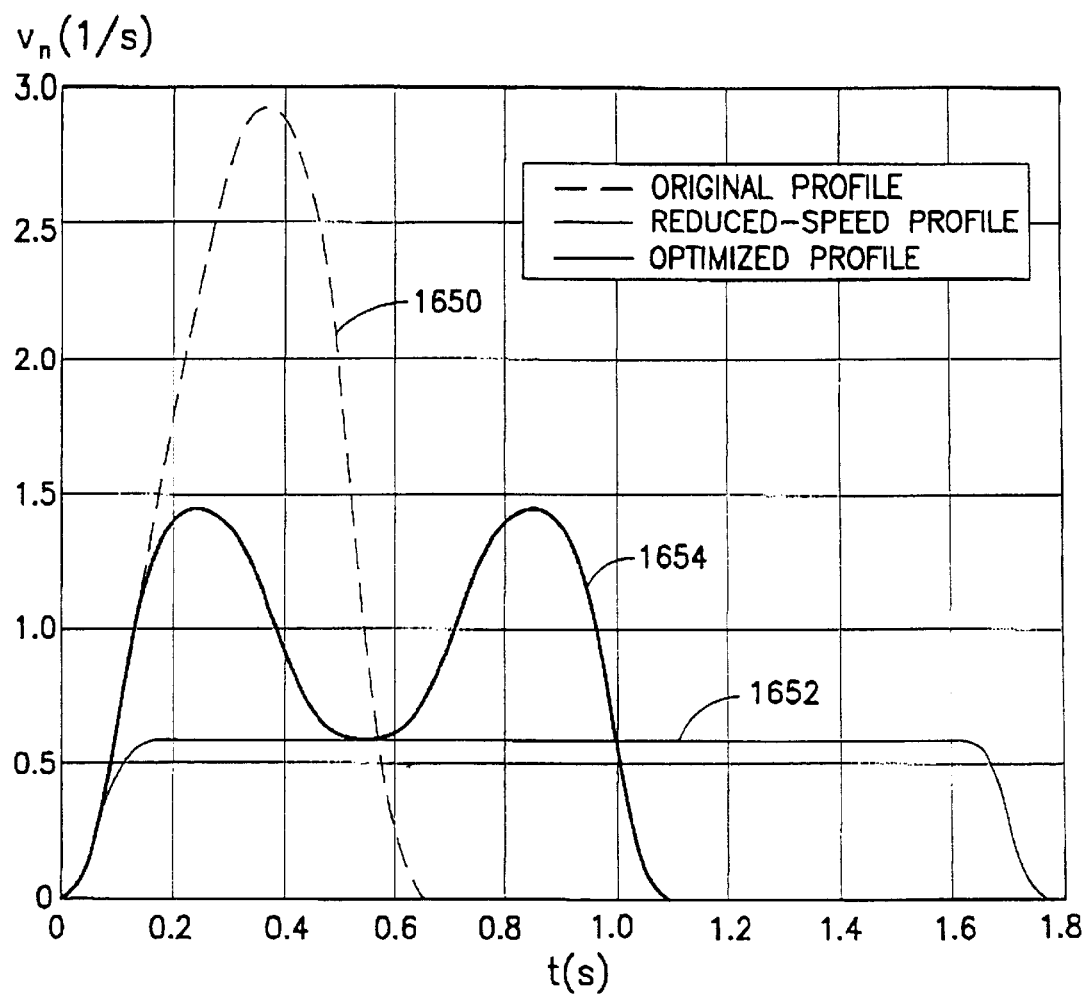
FIG. 16 is a diagram of an embodiment of a motion profile of the present invention showing normalized velocity versus time.

An example of one embodiment of the approach is illustrated in FIGS. 15 and 16. A three-link robotic manipulator with the dimensions of l=0.18415 m and $l_3$=0.33020 m is considered. The maximum allowable translational and rotational velocities, accelerations, jerks and jerk rates of the end-effector are selected as follows: $v_{trn\ lim}$=1×10$^9$ m/s, $a_{trn\ lim}$=10 m/s$^2$, $j_{trn\ lim}$=50 m/s$^3$, $d_{trn\ lim}$=1×10$^9$ m/s$^4$, $v_{ang\ lim}$=1×10$^9$ rad/s, $a_{ang\ lim}$=1×10$^9$ rad/s$^2$, $j_{ang\ lim}$=100 rad/s$^3$ and $d_{ang\ lim}$=1×10$^9$ rad/s$^4$. In addition, angular velocities of the upper arm and forearm are constrained by $\dot{\theta}_{1\ max} = \dot{\theta}_{1\ max}$=5.5 rad/s. The arm is commanded to move from the initial location of $[x_{ini}, y_{ini}, \theta_{3\ ini}]$=[-0.25 m, 0.30 m, 110 deg.] to the destination position of $[x_{dst}, y_{dst}, \theta_{3\ dst}]$=[0.25 m, 0.30 m, 70 deg.].

FIGS. 15 and 16 illustrate three examples of motion profiles 1550, 1552, 1554. The original motion profile 1550 is generated with unlimited angular velocities of the upper arm and forearm, and is shown as a dashed line. A reduced-speed motion profile 1552 is generated with the velocity limit adjusted to comply with the additional constraints imposed on angular velocities of the upper arm 1112 and forearm 1114, and is shown as a hairline. The third example is an optimized motion profile 1554 obtained by superposition of two additional motion profiles at each end of the trajectory to maximize the average velocity of the end-effector, and is shown as a bold line.

FIG. 15 shows a plot of normalized velocity vs. normalized position for each of the three examples. A shaded area 1556 indicates a violation of $\dot{\theta}_{1\ max}$ or $\dot{\theta}_{2\ max}$ and, therefore, a prohibited zone 1556. It is observed that the original profile 1550, shown as a dashed line, enters the prohibited zone 1556. This entry indicates a violation of the maximum allowable angular velocities of the upper arm 1112 and forearm 1114. The reduced-speed profile 1552, shown as a hairline, remains below the prohibited zone 1556. However, the velocity is kept unnecessarily low along the entire trajectory, which translates to undesirable time losses. In contrast, the velocity profile in the optimized case 1554, shown as a bold line, closely follows the position-dependent limit associated with the constraints imposed on the angular velocities of the upper arm 1112 and forearm 1114. The resulting time savings are shown in FIG. 16, where graphs of normalized velocity vs. time are compared for the three motion profiles 1650, 1652, 1654.

Figure 17:
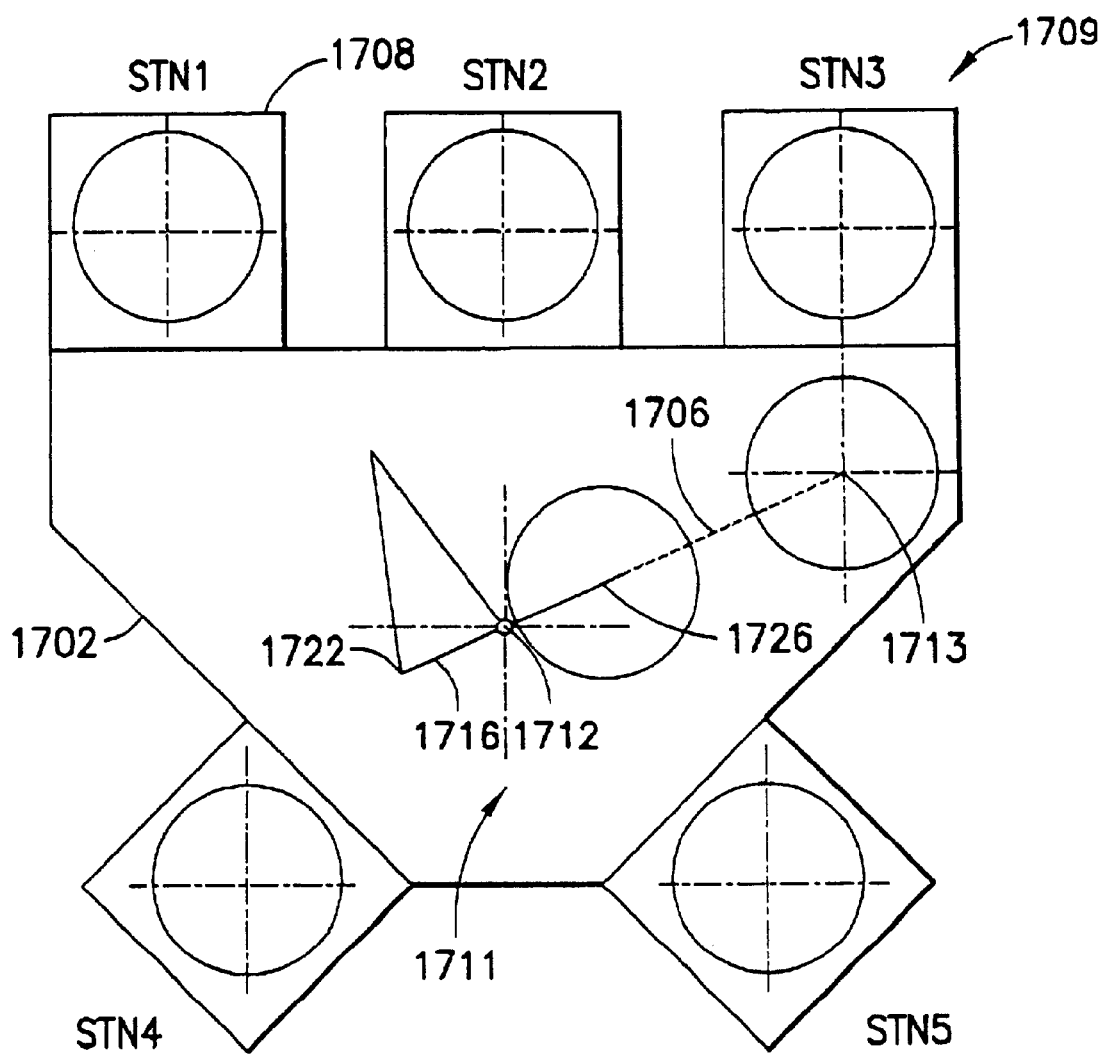
FIG. 17 is a diagram of a motion path of the present invention showing access to a non-radial workstation through a via point.

Referring to FIG. 17, compared to a conventional 2DOF robot manipulator, a distinctive feature of a planar 3DOF robotic manipulator 1711 is the capability for accessing work stations 1708, 1709 that are not oriented radially with respect to the center point 1712 of the cluster tool 1702. Non-radially oriented work stations include work station 1708 and work station 1709. In order to access a non-radial station 1708, 1709, a via point 1713 can be introduced which allows approaching the work station 1709 along a straight-line path. The via point 1713 is specified in terms of x, y coordinates of the reference point 1726 on the end-effector 1716 and in terms of angular orientation $\theta_3$ of the end-effector 1716.

Continuing with FIG. 17, a selection of a one-leg or two-leg paths 1706 can be made if the three-link robotic manipulator 1711 moves from its radially retracted position to a via point 1713 with a non-radial specification of the end-effector orientation, and if the distance of the via point 1713 from the shoulder joint 1712 of the robotic manipulator 1711 is greater then the distance of the reference point 1726 from the wrist joint 1722 of the robotic manipulator 1711.

Figure 19:
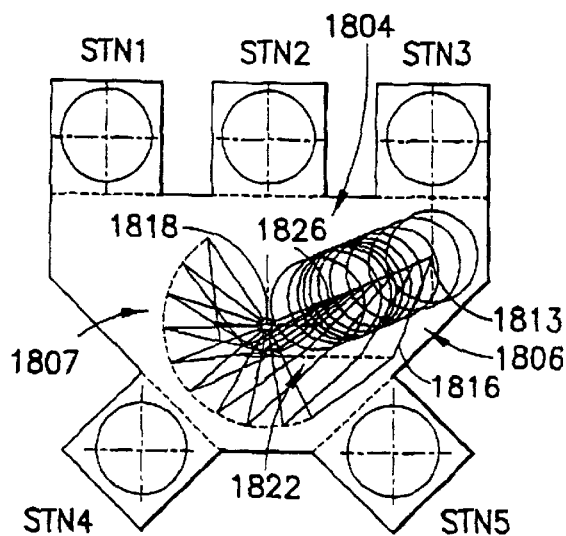

Referring to FIG. 19, a single-leg path 1806 can be selected in which a wrist joint 1822 moves around a shoulder joint 1818. As shown in FIG. 19, the reference point 1826 moves along a straight line toward the via point 1813 while the orientation of the end-effector 1816 is changing gradually from the beginning of the straight-line path 1806. In this case, the wrist joint 1822 travels around the shoulder joint 1818, and the reference point 1826 on the end-effector 1816 reaches the via point 1813 in the opposite configuration relative to the initial position. For example, if the robotic manipulator 1811 begins in a right handed configuration as shown in FIG. 6, the robotic manipulator can end in a left-handed configuration, as shown in FIG. 5, and vice versa.

Figure 18:
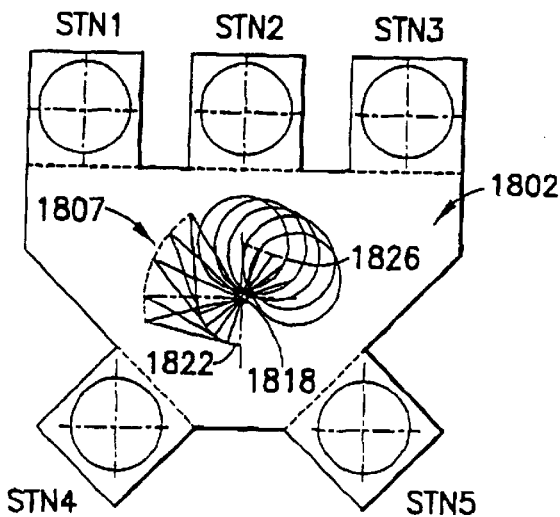
FIGS. 18 to 20 are diagrams of an embodiment of a motion path of the present invention showing access to a non-radial station with wrist joint moving around a center of a robotic manipulator.
Figure 20:
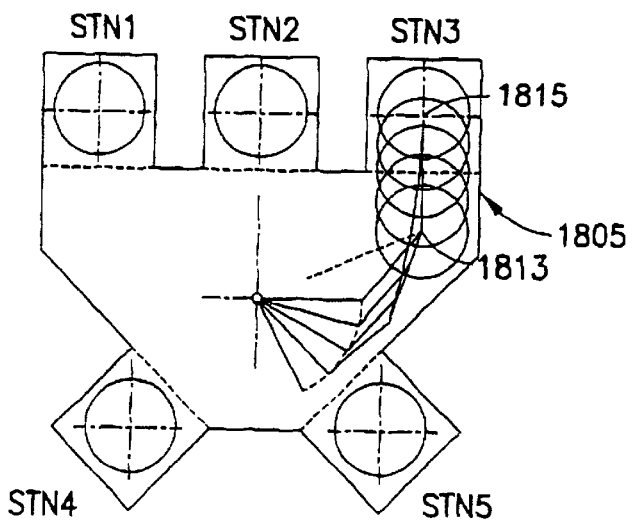

FIG. 18 illustrates rotation of the robotic manipulator 1811 toward the via point 1813 associated with station 1809. FIG. 19 depicts the single-leg motion to the via point 1813. FIG. 20 illustrates an additional leg 1805 from the via point 1813 to the destination point 1815 at station 1809.

Figure 21:
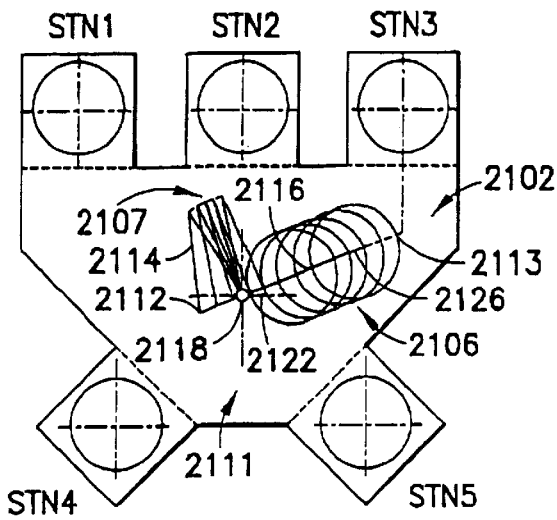
FIGS. 21 to 23 are diagrams of an embodiment of a motion profile of the present invention showing access to a non-radial station with wrist joint moving over a center of a robotic manipulator.
Figure 22:
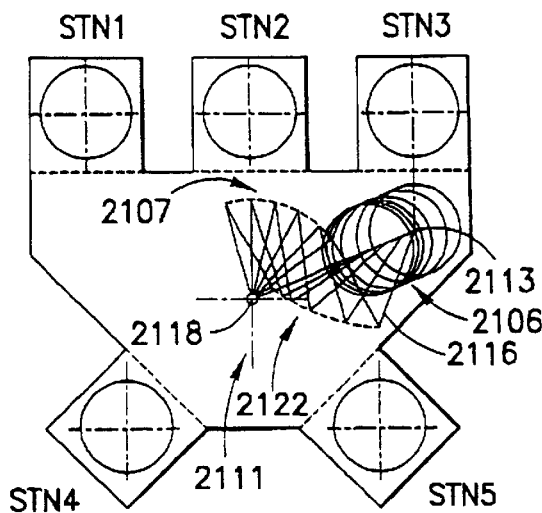

In another embodiment, referring to FIG. 21, a two-leg path 2106 can be selected, which includes the movement of a wrist joint 2122 over a shoulder joint 2118. A reference point 2126 on the end-effector 2116 starts to move along a straight line path 2106 towards the via point 2113 with no change in orientation of the end-effector 2116. The orientation of the end-effector 2116 is kept radial until the wrist joint 2122 of the robotic manipulator 2111 reaches a specified distance beyond the shoulder joint 2118. As shown in FIG. 22, the orientation of the end-effector 2116 starts to change to achieve the specified value at the via point 2113. Since the wrist joint 2122 passes over the shoulder joint 2118, the robotic arm 2111 keeps its initial configuration, i.e., remains left-handed or right-handed.

Figure 23:
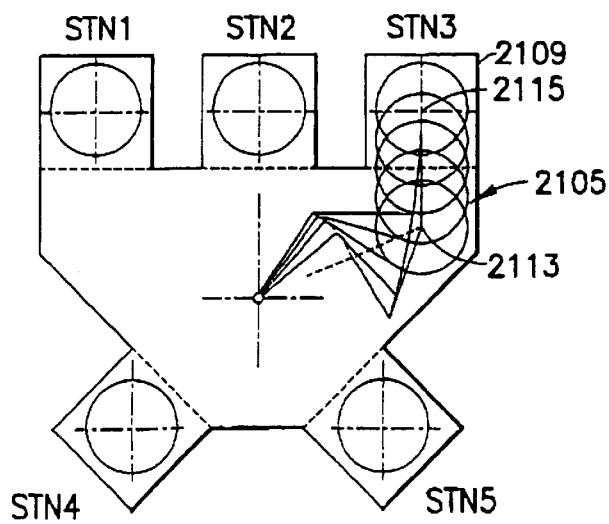

An example of a two-leg path 2106 is depicted in FIGS. 21, 22 and 23. FIGS. 21 and 22 show the two-leg motion from the retracted position of the robotic manipulator 2111 to the via point 2113. FIG. 23 depicts an additional leg 2105 from the via point 2113 to the destination point 2115 at station 2109.

Referring to FIGS. 18, 21 and 22, the option of a single-leg or two-leg paths 1806, 2106 can be considered as a convenient tool for obstacle avoidance and throughput optimization. Considering throughput aspects, the two-leg path approach as shown in FIGS. 21 and 22 is suitable for situations when the required orientation of the end-effector 2116 at the via point 2113 is close to the radial direction. Referring to FIG. 18, the single-leg path 1806 is suitable for cases when the required orientation of the end-effector 1816 at the via point 1813 differs substantially from the radial direction.

The two-leg option as shown in FIGS. 21 and 22 is more appropriate when the required orientation of the end-effector 1216 at the via point 2113 is close to the radial direction. Referring to FIG. 18, the single-leg approach can make the wrist joint 1822 move undesirably close to the shoulder joint 1818, with the upper arm 1812 and forearm 1814 being forced to swing from one side to the other. Considering that the speed of rotation of the upper arm 1812, 2112 and forearm 1814, 2114 is limited by available motor torques, the two-leg option, as shown in FIGS. 21 and 22, is more appropriate in this case since it requires a small adjustment of the end-effector orientation.

Referring to FIGS. 18, 21 and 22, if the required orientation of the end-effector 2116 at the via point 2113 differs substantially from the radial direction, the two-leg path 2106 as shown in FIGS. 21 and 22 requires significant rotation of the end-effector 2116, forearm 2114 and upper arm 2112 along the second leg. The single-leg approach, as shown in FIG. 18, is more suitable for such a setting of the via point 1813.

Continuing with FIGS. 18 to 23, the option to select one of the two approaches can also play an important role for collision avoidance purposes. The path 1807, 2107 of the elbow joint 1820, 2120 is substantially different in the single leg and two leg approaches which result in opposite configurations of the robotic manipulator 1811, 2111 (right-handed vs. left-handed). The selection of one of the two approaches can be used to avoid collision with an obstacle in the robot workspace 1802, 2102 that would otherwise interfere with the path 1807, 2107 of the elbow joint 1820, 2120 of the robotic manipulator 1811, 2111.

Figure 25:
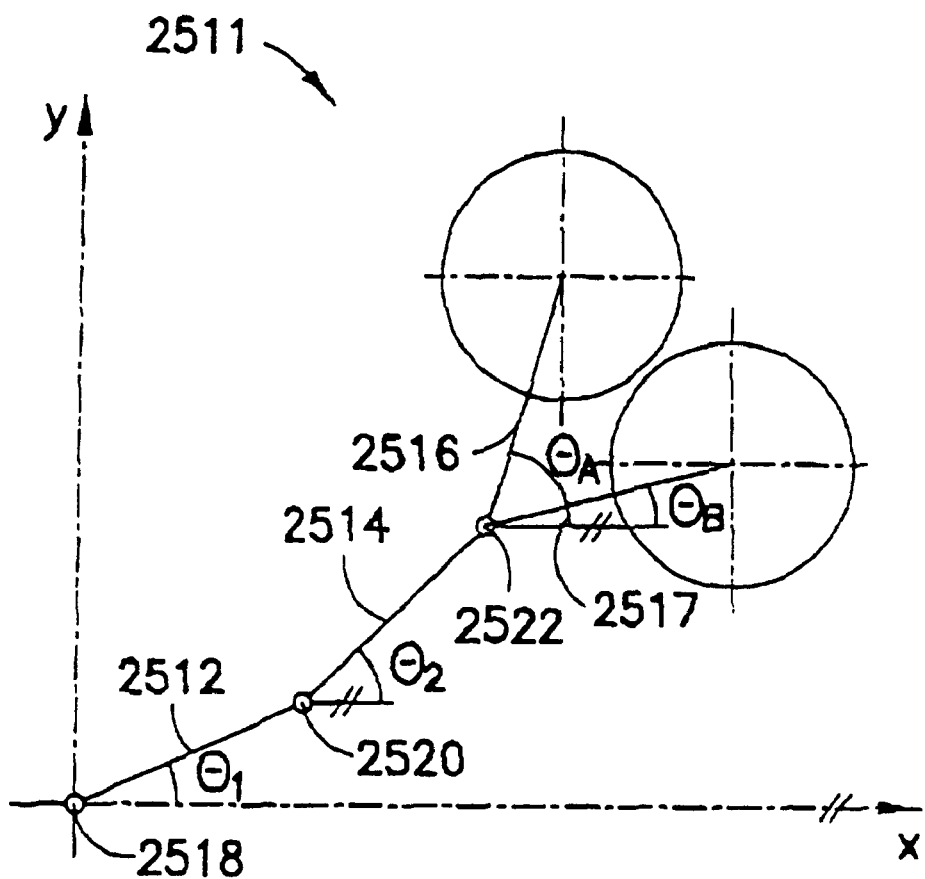
FIG. 25 is a diagram of an embodiment of a robotic arm of the present invention having two end-effectors.

In an alternate embodiment, FIG. 25 schematically depicts a planar robotic manipulator 2511 with two articulated end-effectors 2516, 2517 to which an embodiment of the trajectory planning strategies and the motion control strategies can be applied. The robotic manipulator includes an upper arm 2512, a forearm 2514 and the two end-effectors 2516, 2517, which are coupled through revolute joints 2518, 2520, 2522. Each of the members 2512, 2514, 2516, 2517 of the robotic manipulator 2511 is actuated by an independent motor (not shown).

The motion of the robotic manipulator 2511 of FIG. 25 can be conveniently planned in terms of translation and rotation of one of the end-effectors 2516, or leading end-effector 2516, and rotation of the other end-effector 2517, or trailing end-effector 2517. The end-effectors 2516, 2517 can exchange positions and roles during operation of the robotic manipulator 2511. In order to achieve synchronized motion of the two end-effectors 2516, 2517, the translational and rotational components of motion of the leading end-effector 2516 and the rotational component of motion of the trailing end-effector 2517 can be conveniently obtained as scaled versions of a single normalized motion profile. In order to generate the normalized motion profile, the velocity, acceleration, jerk and jerk rate constraints imposed on the two end-effectors 2516, 2517 need to be converted into a normalized form:

$$v_{max} = \min(|v_{trn\ lim}/s_{trn\ max}|, |v_{ang\ lim\ A}/s_{ang\ max\ A}|, |v_{ang\ lim\ B}/s_{ang\ max\ B}|) \quad (47)$$

$$a_{max} = \min(|a_{trn\ lim}/s_{trn\ max}|, |a_{ang\ lim\ A}/s_{ang\ max\ A}|, |a_{ang\ lim\ B}/s_{ang\ max\ B}|) \quad (48)$$

$$j_{max} = \min(|j_{trn\ lim}/s_{trn\ max}|, |j_{ang\ lim\ A}/s_{ang\ max\ A}|, |j_{ang\ lim\ B}/s_{ang\ max\ B}|) \quad (49)$$

$$d_{max} = \min(|d_{trn\ lim}/s_{trn\ max}|, |d_{ang\ lim\ A}/s_{ang\ max\ A}|, |d_{ang\ lim\ B}/s_{ang\ max\ B}|) \quad (50)$$

where A represents constraints for the leading end-effector 2516 and B represents constraints for the trailing end-effector 2517. The actual translational and rotational components of motion of the leading end-effector 2516, and the actual rotational component of motion of the trailing end-effector 2517 are calculated from the normalized motion profile using the following expressions:

$$s_{trn} = s \times s_{trn\ max},\ v_{trn} = v \times s_{trn\ max},\ a_{trn} = a \times s_{trn\ max} \quad (51)$$

$$s_{ang\ A} = s \times s_{ang\ max\ A},\ v_{ang\ A} = v \times s_{ang\ max\ A},\ a_{ang\ A} = a \times s_{ang\ max\ A} \quad (52)$$

$$s_{ang\ B} = s \times s_{ang\ max\ B},\ v_{ang\ B} = v \times s_{ang\ max\ B},\ a_{ang\ B} = a \times s_{ang\ max\ B} \quad (52)$$

The positions, velocities and accelerations of the upper arm 2512 and forearm 2514, which are typically used for servo control purposes, can be obtained from the motion profiles of the leading end-effector 2516 through the inverse kinematic equation numbers 8 to 14 described previously.

Continuing with FIG. 25, assuming that the two end-effectors 2516, 2517 of the robotic manipulator 2511 can be controlled by a single remote controller 236, as shown in FIGS. 2 and 3, the motion control strategy previously described can be directly applied to the robotic manipulator with multiple end-effectors 2516, 2517. A dynamic model of the robotic manipulator 2511 can be used in the computed-torque control loops on both of the controllers 236, 240. The dynamic model of the robotic manipulator 2511 takes the following form:

$$\{\tau\} = [M]\{[I]\ddot{s}\ \ddot{s}\ \ddot{g}\ \ddot{v}\} + [h]\{\dot{\theta}^2\} \quad (54)$$

where:

$$\{\tau\} = \{\tau_1\ \tau_2\ \tau_A\ \tau_B\}^T,$$

$$\{\theta\} = \{\theta_1\ \theta_2\ \theta_A\ \theta_B\}^T,$$

$$\{\dot{\theta}^2\} = \{\dot{\theta}_1^2\ \dot{\theta}_2^2\ \dot{\theta}_A^2\ \dot{\theta}_B^2\}^T \quad (55)$$

The symbol $\{\tau\}$ stands for a vector of torques which drive the members 2512, 2514, 2516, 2517 of the robotic manipulator 2511, typically referred to as joint torques. Referring to FIGS. 2, 3, 4 and 25, the determination of the torques of the corresponding motors 228, 230, 232, (and a fourth motor for the second end-effector, not shown) is similar to the transformation performed for a robotic manipulator 211 with a single end-effector 216. The torques of the corresponding motors 228, 230, 232 can be obtained from the joint torques through this additional transformation that reflects the actual mechanical arrangement of motors 228, 230, 232. The elements of the matrices $[M]$ and $[h]$, denoted as $M_{ij}$ and $h_{ij}$, $i, j = 1, 2, A, B$, are defined as follows:

$$M_{11} = I_1 + (m_2 + m_A + m_B)l^2 \qquad M_{12} = (m_2 l_{g2} + m_A l + m_B l)lc_{21} \quad (56)$$

$$M_{1A} = m_A ll_{gA} c_{A1} \qquad M_{1B} = m_B ll_{gB} c_{B1} \quad (57)$$

$$M_{21} = (m_2 l_{g2} + m_A l + m_B l)lc_{21} \qquad M_{22} = I_2 + (m_A + m_B)l^2 \quad (58)$$

$$M_{2A} = m_A ll_{gA} c_{A2} \qquad M_{2B} = m_B ll_{gB} c_{B2} \quad (59)$$

$$M_{A1} = m_A ll_{gA} c_{A1} \qquad M_{A2} = m_A ll_{gA} c_{A2} \qquad M_{AA} = I_A \qquad M_{AB} = 0 \quad (60)$$

$$M_{B1} = m_B ll_{gB} c_{B1} \qquad M_{B2} = m_B ll_{gB} c_{B2} \qquad M_{BA} = 0 \qquad M_B = I_B \quad (61)$$

$$h_{11} = 0 \qquad h_{12} = -(m_2 l_{g2} + m_A l + m_B l)ls_{21} \qquad h_{1A} = -m_A ll_{gA} s_{A1} \qquad h_{1B} = -m_B ll_{gB} s_{B1} \quad (62)$$

$$h_{21} = (m_2 l_{g2} + m_A l + m_B l)ls_{21} \qquad h_{22} = 0 \qquad h_{2A} = -m_A ll_{gA} s_{A2} \qquad h_{2B} = -m_B ll_{gB} s_{B2} \quad (63)$$

$$h_{A1} = m_A ll_{gA} s_{A1} \qquad h_{A2} = m_A ll_{gA} s_{A2} \qquad h_{AA} = 0 \qquad h_{AB} = 0 \quad (64)$$

$$h_{B1} = m_B ll_{gB} s_{B1} \qquad h_{B2} = m_B ll_{gB} s_{B2} \qquad h_{BA} = 0 \qquad h_{BB} = 0 \quad (65)$$

where $I_i$, $m_i$ and $l_{gi}$, $i=1, 2, A, B$, represent the dynamic properties of the four members 2512, 2514, 2516, 2517 of the robotic manipulator 2511 as defined in Table 1, and $c_{ij} = \cos(\theta_i - \theta_j)$, $s_{ij} = \sin(\theta_i - \theta_j)$. As previously described for a robotic manipulator 211 with a single end-effector 216, no run-time data are shared by the two controllers 236, 240. In order to account for dynamic coupling between the members 2512, 2514, 2516, 2517 of the robotic manipulator 2511 without sharing run-time data, the actual positions and velocities of the two end-effectors 2516, 2517 are replaced by the commanded values in the control loop on the main controller 240, and the actual positions and velocities of the upper arm 2512 and the forearm 2514 are substituted by the commanded values in the control loop on the remote controller 236.

The present invention includes a method for moving a substrate or workpiece between radial and non-radial robotic stations with less trajectory planning overhead due to a small number of calculations performed prior to the motion, and reduces costs associated with memory components required to store data prior to the motion since calculation of entire motion profiles prior to the motion is avoided. The present invention can also achieve shorter motion times to and from non-radial stations due to optimized selection of the sequence of the motion path legs. The present invention can also avoid interference of the robotic arm with obstacles in the workspace by providing option to execute the desired motion of the substrate or workpiece in different configurations of the links of the robotic arm. In addition, the present invention can provide better maneuverability and non-iterative access to non-radial stations when the robotic manipulator is under manual operation or in a station teaching mode.

For a distributed type of motion control, the present invention can reduce assembly costs and reliability risks because less number of long signal wires are fed through the links, joints and slip-rings of the robotic arm in comparison to a centralized control architecture. The motion control of the present invention can also improve accuracy of trajectory tracking compared to state-of-the-art distributed architecture controllers which run independent joint-based feedback loops and do not account for dynamic coupling between links and other members of the robotic manipulator. In addition, compared to state-of-the-art distributed architecture control methods which utilize high-speed communication networks to achieve synchronized operation and to account for dynamic coupling between links and other members of the robotic manipulator, the motion control of the present invention can improve implementation, cost and reliability aspects since the use of run-time data shared through high-speed networks is avoided.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A method for moving a substrate to a predetermined location with a specified orientation with a robotic manipulator, the robotic manipulator having a plurality of joint actuators and an end-effector for holding the substrate, wherein the end-effector is independently rotatable with respect to the remaining robotic manipulator, the method comprising the steps of:
  selecting a reference point on the end-effector for determining a position of the end-effector, wherein the reference point is offset from a wrist of the robotic manipulator;
  determining a motion path for movement of the reference point on the end-effector of the robotic arm toward a predetermined location with a specified orientation;
  generating motion profiles for translation of the reference point on the end-effector along the motion path and rotation of the end-effector with respect to the reference point; and
  converting the motion profiles into joint motion profiles for each of the joint actuators of the robotic manipulator for implementing the movement of the end-effector to the predetermined location with the specified orientation.

2. The method of claim 1, wherein determining the motion path comprises defining a set of points along the motion path for movement of the reference point on the end-effector through the points.

3. The method of claim 2, wherein determining the motion path comprises generating straight line legs between the points to create a substantially continuous path.

4. The method of claim 3, wherein generating the motion profiles includes generating a motion profile for each leg.

5. The method of claim 4, wherein generating the motion profiles along the straight line legs of the motion path includes specifying a set of constraints for each of the legs.

6. The method of claim 5, wherein specifying a set of constraints includes defining maximum velocities, accelerations, jerks and jerk rates for translational and rotational movement of the end-effector for each of the legs.

7. The method of claim 4, wherein generating the motion profiles along the straight line legs of the motion path includes the steps of:
  decomposing each leg into a translation of the reference point with respect to each leg to determine the length of each leg; and
  determining the rotation of the end-effector with respect to the reference point for each leg to calculate the angular increment of the rotation for each leg.

8. The method of claim 3, wherein generating the motion profiles includes synchronizing the translational and rotational components for each leg so that the translational and rotational components of movement of the end-effector begin at the same time.

9. The method of claim 3, wherein generating the motion profiles includes synchronizing the translational and rotational components of each leg so that the translational and rotational components of movement of the end-effector end at the same time.

10. The method of claim 9, wherein synchronizing includes adjusting the constraints for each leg.

11. The method of claim 4, wherein generating the motion profile for each leg includes decomposing a leg into a plurality of sub legs which can be fully or partially overlapped if constraints associated with the links or actuators of the robotic manipulator are exceeded.

12. The method of claim 1, wherein the step of selecting the reference point includes selecting a center of the substrate holding area on the end-effector as the reference point.

13. The method of claim 1, wherein determining the motion path includes determining whether the predetermined location has a non-radial orientation with respect to the robotic manipulator, and if so, designating a via point so as to be able to generate motion path containing straight-line legs.

14. The method of claim 1, wherein generating the motion path comprises selecting one of at least two different paths for obstacle avoidance and throughput optimization of the robotic manipulator.

15. The method of claim 14, wherein selecting one of at least two different paths comprises selecting a single-leg path or a two-leg path for a leg of the selected path between a retracted position of the robotic manipulator and a via point.

16. An apparatus for movement of at least one substrate to a predetermined location with a specified orientation, comprising:

a robotic manipulator having a plurality of joint actuators and at least one end-effector for holding at least one substrate, wherein the at least one end-effector is independently rotatable with respect to the remaining robotic manipulator;

a controller connected to the robotic manipulator for generating motion profiles for movement of a substrate holding area of the end-effector along a desired motion path, wherein the controller is programmed for forming the motion profiles from a combination of a translation of a reference point along the motion path and rotation of the end-effector with respect to the reference point, the reference point on the end-effector being offset from a wrist of the robotic manipulator; and wherein the controller determines determine a joint motion profile for each of the joint actuators of the robotic manipulator for implementing the motion profiles for movement of the end-effector to the predetermined location with the specified orientation.

17. The apparatus of claim 16, wherein the robotic manipulator includes at least two end-effectors.

18. A method for moving a substrate with a robotic manipulator to a predetermined location with a specified orientation, the method comprising the steps of:

providing the robotic manipulator with a plurality of joint actuators and an end-effector for holding the substrate at an end of the robotic manipulator;

providing a first controller in communication with the robotic manipulator for determining the desired joint motion profiles and desired commanded torques for the joint actuators associated with the first controller;

providing a second controller in communication with the robotic manipulator for determining the desired joint motion profiles and desired commanded torques for the joint actuators associated with the second controller;

generating with the first controller nodal points of motion profiles in the first controller for translation and rotation of the end-effector along the motion path;

transmitting the nodal points from the first controller to the second controller; and initiating a synchronized run-time calculation of the motion profiles in the first controller and in the second controller based on the generated nodal points in the first controller and in the second controller, wherein the run-time calculation in the first controller and in the second controller are performed separately of each other.

19. The method of claim 18, further comprising determining the joint motion profiles for the joint actuators associated with the second controller in accord with the run-time calculation of the motion profiles for translation and rotation of the end-effector at the second controller and independent of the first controller.

20. The method of claim 18, further comprising determining the joint motion profiles for the joint actuators associated with the first controller in accord with the run-time calculation of the motion profiles for translation and rotation of the end-effector at the first controller and independent of the second controller.

21. The method of claim 18, wherein determining the desired commanded torques for the joint actuators associated with the first controller and with the second controller includes accounting for dynamic coupling between members of the robotic manipulator without sharing of run-time data between the first controller and the second controller.

22. An apparatus for moving a substrate with a robotic manipulator to a predetermined location with a specified orientation, the apparatus comprising:

an end-effector for holding the substrate at an end of the robotic manipulator, wherein the robotic manipulator has a plurality of joint actuators;

a first controller in communication with the robotic manipulator for determining the desired position of the joint actuators associated with the first controller;

a second controller in communication with the robotic manipulator for determining the desired position of the joint actuators associated with the second controller;

wherein the first controller generates generate nodal points of the motion profiles in the first controller for translation and rotation of the end-effector along the motion path, and to transmit the nodal points from the first controller to the second controller; and a communication line connecting the first controller and the second controller for transmitting nodal points from the first controller to the second controller, wherein the first controller and the second controller separately perform run-time calculation of the motion profiles based on the generated nodal points in the first controller and in the second controller, and the run-time calculation is initiated synchronously.

23. The apparatus of claim 22, wherein the second controller is coupled with the robotic manipulator for controlling the end-effector and minimizing the length of signal lines between the second controller and the joint actuator associated with the second controller and with the end-effector.

24. The apparatus of claim 22, wherein the second controller determines the positions of the joint actuators associated with the second controller in accord with the run-time calculation of the motion profiles at the second controller, and wherein the first controller determines the positions of the joint actuators associated with the first controller in accord with the run-time calculation of the motion profiles at the first controller.

25. A method for moving substrate between two points with a robotic arm having a distributed control system, a plurality of joint actuators for moving the robotic arm, and an end-effector for removeably retaining the substrate, the method comprising the steps of:

generating motion profiles with a main controller coupled to the robotic arm for controlling at least one from the plurality of the joint actuators associated with the main controller;

generating the motion profiles with a remote controller coupled to the robotic arm for controlling at least one other from the plurality of joint actuators associated with the end-effector; and executing the motion profiles in the main controller and the motion profile in the remote controller separately from each other, wherein the executing is synchronously initiated.

26. A robotic arm with a distributed control system and an end-effector for moving substrate between two points, comprising:

joint actuators coupled to the robotic arm for controlling the position and orientation of the robotic arm;

a main controller for generating motion profiles for controlling at least one joint actuator associated with the main controller from the joint actuators coupled to the robotic arm;

a remote controller for generating the motion profiles for controlling at least one other joint actuator associated with the end-effector from the joint actuators coupled to the robotic arm, wherein the substrate is removeably attached to the end-effector; and wherein the main controller and remote controller each execute their motion profiles separately from each other, wherein the execution is synchronously initiated.

27. The robotic arm of claim 26, further comprising:

a software module implemented in the main controller and in the remote controller for generating the motion profiles, wherein the motion profiles are a translation of a reference point between two points and rotation of the end-effector with respect to the reference point, wherein the reference point is selected on the end-effector for determining the position of the end-effector along a motion path.

* * * * *

UNITED STATES PATENT AND TRADEMARK OFFICE
CERTIFICATE OF CORRECTION

PATENT NO.    : 6,643,563 B2
DATED         : November 4, 2003
INVENTOR(S)   : Hosek et al.

It is certified that error appears in the above-identified patent and that said Letters Patent is hereby corrected as shown below:

Title page,
Item [74], *Attorney, Agent, or Firm*, after "Perman & Green, LLP" please add
-- Richard Pickreign --

Column 25,
Line 18, between "determines" and "a" please remove "determine"

Column 26,
Line 16, between "generates" and "nodal" please remove "generate"

Signed and Sealed this

Twenty-sixth Day of October, 2004

JON W. DUDAS
*Director of the United States Patent and Trademark Office*